United States Patent
Chung et al.

(10) Patent No.: US 9,755,074 B2
(45) Date of Patent: Sep. 5, 2017

(54) SEMICONDUCTOR DEVICE INCLUDING A MULTI-CHANNEL ACTIVE PATTERN

(71) Applicant: SAMSUNG ELECTRONICS CO., LTD., Suwon-si, Gyeonggi-do (KR)

(72) Inventors: Jae-Yup Chung, Yongin-si (KR); Hee-Soo Kang, Seoul (KR); Hee-Don Jeong, Hwaseong-si (KR); Se-Wan Park, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/953,769

(22) Filed: Nov. 30, 2015

(65) Prior Publication Data
US 2016/0163877 A1 Jun. 9, 2016

(30) Foreign Application Priority Data
Dec. 3, 2014 (KR) .................. 10-2014-0172421

(51) Int. Cl.
*H01L 29/78* (2006.01)
*H01L 27/088* (2006.01)

(52) U.S. Cl.
CPC ...... *H01L 29/7848* (2013.01); *H01L 27/0886* (2013.01); *H01L 29/785* (2013.01)

(58) Field of Classification Search
CPC ............. H01L 29/66795; H01L 29/785; H01L 27/0886; H01L 21/823431; H01L 21/845; H01L 27/10879; H01L 27/108798
See application file for complete search history.

(56) References Cited

U.S. PATENT DOCUMENTS

| | | | |
|---|---|---|---|
| 6,465,870 B2 | 10/2002 | Voldman | |
| 8,299,564 B1 | 10/2012 | Wu et al. | |
| 8,502,301 B2 | 8/2013 | Suzuki et al. | |
| 8,658,486 B2 | 2/2014 | Aquilino et al. | |
| 8,680,625 B2 | 3/2014 | Fan et al. | |
| 8,703,594 B2 | 4/2014 | Yeh et al. | |
| 2005/0263795 A1* | 12/2005 | Choi | H01L 29/66795 257/213 |
| 2007/0020864 A1* | 1/2007 | Chong | H01L 29/165 438/300 |
| 2012/0217583 A1 | 8/2012 | Zhu et al. | |

(Continued)

FOREIGN PATENT DOCUMENTS

KR 1020150000947 1/2015

*Primary Examiner* — Tucker J Wright
(74) *Attorney, Agent, or Firm* — F. Chau & Associates, LLC

(57) ABSTRACT

A semiconductor device includes a first multi-channel active pattern, a field insulation layer disposed on the first multi-channel active pattern and including a first region and a second region, the first region having a top surface protruding from a top surface of the second region to a top surface of the first multi-channel active pattern, a first gate electrode crossing the first multi-channel active pattern, the first gate electrode being disposed on the field insulation layer, and a first source or drain disposed between the first gate electrode and the first region of the field insulation layer and including a first facet, the first facet being disposed adjacent to the first region of the field insulation layer at a point lower than the top surface of the first multi-channel active pattern.

16 Claims, 20 Drawing Sheets

(56) References Cited

U.S. PATENT DOCUMENTS

| | | | |
|---|---|---|---|
| 2013/0043535 A1* | 2/2013 | Anderson | H01L 21/84 257/347 |
| 2013/0187237 A1 | 7/2013 | Yu et al. | |
| 2013/0244389 A1 | 9/2013 | Cheng et al. | |
| 2014/0027820 A1 | 1/2014 | Aquilino et al. | |
| 2014/0151759 A1 | 6/2014 | Loubet et al. | |
| 2014/0353763 A1 | 12/2014 | Chung et al. | |
| 2014/0374830 A1 | 12/2014 | Jeong et al. | |

* cited by examiner

SEMICONDUCTOR DEVICE INCLUDING A MULTI-CHANNEL ACTIVE PATTERN

CROSS-REFERENCE TO RELATED APPLICATION

This application claims priority under 35 U.S.C. §119 to Korean Patent Application No. 10-2014-0172421 filed on Dec. 3, 2014 in the Korean Intellectual Property Office, the disclosure of which is incorporated by reference herein in its entirety.

TECHNICAL FIELD

The present inventive concept relates to a semiconductor device, and more particularly, to a semiconductor device including a multi-channel active pattern.

DESCRIPTION OF THE RELATED ART

In an example scaling technique for increasing the density of a semiconductor device, a multi-gate transistor structure includes a multi-channel active pattern (or a silicon body). The multi-channel active pattern has a fin shape or a nanowire and is formed on a substrate. A gate is formed on a surface of the multi-channel active pattern.

Since the multi-gate transistor structure uses a three-dimensional channel, scaling is achieved. In addition, current is controlled without increasing a length of the gate. Further, a short channel effect (SCE) in which a potential of a channel region is affected by a drain voltage can be suppressed.

SUMMARY

According to an exemplary embodiment of the present inventive concept, there is provided a semiconductor device including a first multi-channel active pattern, a field insulation layer disposed on the first multi-channel active pattern and including a first region and a second region, the first region having a top surface protruding from a top surface of the second region to a top surface of the first multi-channel active pattern, a first gate electrode crossing the first multi-channel active pattern, the first gate electrode being disposed on the field insulation layer, and a first source or drain disposed between the first gate electrode and the first region of the field insulation layer and including a first facet, the first facet being disposed adjacent to the first region of the field insulation layer at a point lower than the top surface of the first multi-channel active pattern.

In an exemplary embodiment of the present inventive concept, the first source or drain contacts the first region of the field insulation layer.

In an exemplary embodiment of the present inventive concept, the first facet contacts a sidewall of the first region of the field insulation layer.

In an exemplary embodiment of the present inventive concept, a material interposed between the first facet and a sidewall of the first region of the field insulation layer is different from a material of the first multi-channel active pattern.

In an exemplary embodiment of the present inventive concept, the first source or drain does not include a surface extending along a sidewall of the first region of the field insulation layer.

In an exemplary embodiment of the present inventive concept, the first facet does not contact the first multi-channel active pattern.

In an exemplary embodiment of the present inventive concept, the semiconductor device may further comprise a dummy gate electrode disposed on the first region of the field insulation layer.

In an exemplary embodiment of the present inventive concept, a top surface of the first gate electrode is coplanar with a top surface of the dummy gate electrode.

In an exemplary embodiment of the present inventive concept, the semiconductor device may further comprise a spacer disposed on a sidewall of the dummy gate electrode. At least a portion of a bottom surface of the spacer overlaps with the first source or drain.

In an exemplary embodiment of the present inventive concept, the semiconductor may further comprise an insulation pattern interposed between the spacer and a region of the first source or drain overlapping with the spacer.

In an exemplary embodiment of the present inventive concept, the first region of the field insulation layer includes a protrusion part overlapping with the first source or drain.

In an exemplary embodiment of the present inventive concept, the semiconductor may further comprise an insulation pattern interposed between the protrusion part and a region of the first source or drain overlapping with the protrusion part.

In an exemplary embodiment of the present inventive concept, the semiconductor may further comprise a second multi-channel active pattern parallel with the first multi-channel active pattern, the first region of the field insulation layer being interposed between the first multi-channel active pattern and the second multi-channel active pattern, a second gate electrode crossing the second multi-channel active pattern, the second gate electrode being disposed on the field insulation layer, and a second source or drain disposed between the second gate electrode and the first region of the field insulation layer. The second source or drain includes a second facet disposed adjacent to the sidewall of the first region of the field insulation layer.

In an exemplary embodiment of the present inventive concept, the semiconductor may further comprise a dummy gate electrode disposed on the first region of the field insulation layer, and a spacer disposed on a sidewall of the dummy gate electrode. A bottom surface of the spacer overlaps with the first source or drain and the second source or drain.

In an exemplary embodiment of the present inventive concept, the semiconductor may further comprise a dummy gate electrode disposed on the first region of the field insulation layer, and a spacer disposed on the sidewall of the dummy gate electrode. A bottom surface of the spacer overlaps with the first source or drain and does not overlap with the second source or drain.

In an exemplary embodiment of the present inventive concept, the semiconductor may further comprise an insulation pattern interposed between the spacer and a region of the first source or drain overlapping with the spacer.

In an exemplary embodiment of the present inventive concept, a distance of the first facet to the sidewall of the first region of the field insulation layer increases approaching the top surface of the first region of the field insulation layer.

In an exemplary embodiment of the present inventive concept, the first multi-channel active pattern has long sides extended in a first direction and short sides extended in a second direction, the first region of the field insulation layer contacts the short sides of the first multi-channel active pattern and the second region of the field insulation layer contacts the long sides of the first multi-channel active pattern.

In an exemplary embodiment of the present inventive concept, the top surface of the second region of the field insulation layer is lower than the top surface of the first multi-channel active pattern.

In an exemplary embodiment of the present inventive concept, the first multi-channel active pattern is a fin type active pattern or a wire pattern.

According to an exemplary embodiment of the present inventive concept, there is provided a semiconductor device including a multi-channel active pattern, a field insulation layer disposed on at least two sides of the first multi-channel active pattern and including a first region and a second region, a dummy gate electrode disposed on the first region of the field insulation layer, a gate electrode crossing the multi-channel active pattern, the gate electrode being disposed on the second region of the field insulation layer, the gate electrode having a height greater than that of the dummy gate electrode, and a source or drain disposed between the gate electrode and the dummy gate electrode and including a facet, wherein the facet is adjacent to a sidewall of the first region of the field insulation layer.

In an exemplary embodiment of the present inventive concept, a material interposed between the facet and the sidewall of the first region of the field insulation layer is different from a material of the multi-channel active pattern.

In an exemplary embodiment of the present inventive concept, a height of the first region of the field insulation layer is greater than a height of the second region of the field insulation layer.

In an exemplary embodiment of the present inventive concept, a top surface of the first region of the field insulation layer is coplanar with a top surface of the multi-channel active pattern or higher than the top surface of the multi-channel active pattern.

In an exemplary embodiment of the present inventive concept, the semiconductor may further comprise a spacer disposed on a sidewall of the dummy gate electrode. At least a portion of the spacer overlaps with the source or drain.

In an exemplary embodiment of the present inventive concept, the semiconductor may further comprise an interlayer insulation layer covering the source or drain on the field insulation layer. A portion of the interlayer insulation layer is interposed between the spacer and a region of the source or drain overlapping with the spacer.

In an exemplary embodiment of the present inventive concept, the first region of the field insulation layer includes a protrusion part overlapping with the source or drain.

In an exemplary embodiment of the present inventive concept, the semiconductor may further comprise an interlayer insulation layer covering the source or drain on the field insulation layer. A portion of the interlayer insulation layer is disposed between the protrusion part and a region of the source or drain overlapping with the protrusion part.

In an exemplary embodiment of the present inventive concept, a top surface of the dummy gate electrode is coplanar with a top surface of the gate electrode.

According to an exemplary embodiment of the present inventive concept, there is provided a semiconductor device including a first multi-channel active pattern and a second multi-channel active pattern arranged in a first direction and parallel with each other in the first direction, a field insulation layer disposed on the first and second multi-channel active patterns and including a first region and a second region, the first region being disposed between a first side of the first multi-channel active pattern and a first side of the second multi-channel active pattern and having a top surface higher than a top surface of the second region, a gate electrode crossing the first multi-channel active pattern, the gate pattern being disposed on the field insulation layer, a dummy gate electrode disposed on the first region of the field insulation layer, a source or drain disposed between the gate electrode and the dummy gate electrode and including a facet, the facet being adjacent to a sidewall of the first region of the field insulation layer, and a spacer disposed on a sidewall of the dummy gate electrode, the spacer having a bottom surface overlapping with the source or drain.

In an exemplary embodiment of the present inventive concept, the semiconductor device may further comprise an insulation pattern interposed between the spacer and a region of the source or drain overlapping with the spacer.

In an exemplary embodiment of the present inventive concept, a material interposed between the facet and the sidewall of the first region of the field insulation layer is different from a material of the first multi-channel active pattern.

According to an exemplary embodiment of the present inventive concept, there is provided a semiconductor device including a first multi-channel active pattern disposed in a first region of a substrate, a second multi-channel active pattern disposed in a second region of the substrate, a field insulation layer including a first region and a second region disposed on the first multi-channel active pattern and a third region and a fourth region disposed on the second multi-channel active pattern, the first region having a top surface higher than a top surface of the second region and the third region having a top surface higher than a top surface of the fourth region, a first gate electrode crossing the first multi-channel active pattern on the field insulation layer, a second gate electrode crossing the second multi-channel active pattern on the field insulation layer, a first source or drain disposed between the first gate electrode and the first region of the field insulation layer and including a first facet, the first facet being disposed adjacent to the first region of the field insulation layer at a point lower than the top surface of the first multi-channel active pattern, and a second source or drain disposed between the second gate electrode and the third region of the field insulation layer.

In an exemplary embodiment of the present inventive concept, a material interposed between the first facet and a sidewall of the first region of the field insulation layer is different from a material of the first multi-channel active pattern.

In an exemplary embodiment of the present inventive concept, the semiconductor device may further comprise a first dummy gate electrode disposed on the first region of the field insulation layer, and a first spacer disposed on a sidewall of the first dummy gate electrode.

In an exemplary embodiment of the present inventive concept, a bottom surface of the first spacer overlaps with the first source or drain. The semiconductor device may further comprise an insulation pattern interposed between the first spacer and a region of the first source or drain overlapping with the first spacer.

In an exemplary embodiment of the present inventive concept, the semiconductor device may further comprise a second dummy gate electrode disposed on the third region of the field insulation layer, and a second spacer disposed on a sidewall of the second dummy gate electrode. The second source or drain contacts the second spacer.

In an exemplary embodiment of the present inventive concept, the semiconductor device may further comprise a semiconductor part disposed between the second source or drain and the third region of the field insulation layer.

In an exemplary embodiment of the present inventive concept, the second source or drain includes a second facet adjacent to a sidewall of the third region of the field insulation layer.

In an exemplary embodiment of the present inventive concept, the second multi-channel active pattern is not interposed between the second facet and the third region of the field insulation layer.

In an exemplary embodiment of the present inventive concept, the semiconductor device may further comprise a second dummy gate electrode disposed on the third region of the field insulation layer, and a second spacer disposed on a sidewall of the second dummy gate electrode. The second source or drain does not contact the second spacer.

In an exemplary embodiment of the present inventive concept, a bottom surface of the second spacer overlaps with the second source or drain. The semiconductor device may further comprise an insulation pattern interposed between the second spacer and a region of the second source or drain overlapping with the second spacer.

In an exemplary embodiment of the present inventive concept, long sides of the first multi-channel active pattern extend in a first direction and long sides of the second multi-channel active pattern extend in a second direction, a first width of the first region of the field insulation layer in the first direction is different from a second width of the third region of the field insulation layer in the second direction.

In an exemplary embodiment of the present inventive concept, a height of the first region of the field insulation layer is substantially the same as a height of the third region of the field insulation layer.

In an exemplary embodiment of the present inventive concept, a top surface of the second region of the field insulation layer is coplanar with a top surface of the fourth region of the field insulation layer.

According to an exemplary embodiment of the present inventive concept, there is provided a semiconductor device, comprising: a multi-channel active pattern; a field insulation layer disposed on first and second sides of the multi-channel active pattern, the field insulation layer including a first region extending to a top surface of the multi-channel active pattern; a gate electrode overlapping the multi-channel active pattern and contacting the field insulation layer on the first and second sides of the multi-channel active pattern; and a source or drain disposed between the gate electrode and the first region of the field insulation layer, the source or drain including an edge that extends from the first region of the field insulation layer to the gate electrode.

In an exemplary embodiment of the present inventive concept, a material different from a material of the multi-channel active pattern is disposed in an area adjacent to the edge of the source or drain.

In an exemplary embodiment of the present inventive concept, a sidewall of the first region of the field insulation layer forms a side of the area adjacent to the edge of the source or drain.

In an exemplary embodiment of the present inventive concept, an insulation pattern is disposed along the side of the area adjacent to the edge of the source or drain.

In an exemplary embodiment of the present inventive concept, a dummy gate electrode is disposed on the first region of the field insulation layer.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present.

It will also be understood that when a layer is referred to as being "on" another layer or substrate, it can be directly on the other layer or substrate, or intervening layers may also be present.

The use of the terms "a" and "an" and "the" and similar referents in the context of describing the inventive concept are to be construed to cover both the singular and the plural, unless otherwise indicated herein or clearly contradicted by context.

Figure 1:
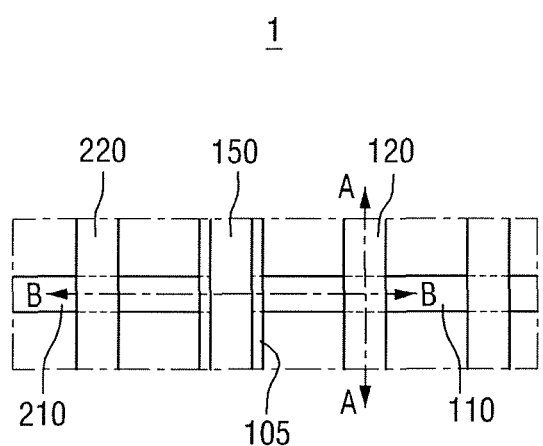
FIGS. 1 and 2 are a layout view and a perspective view illustrating a semiconductor device according to an exemplary embodiment of the present inventive concept.
Figure 2:
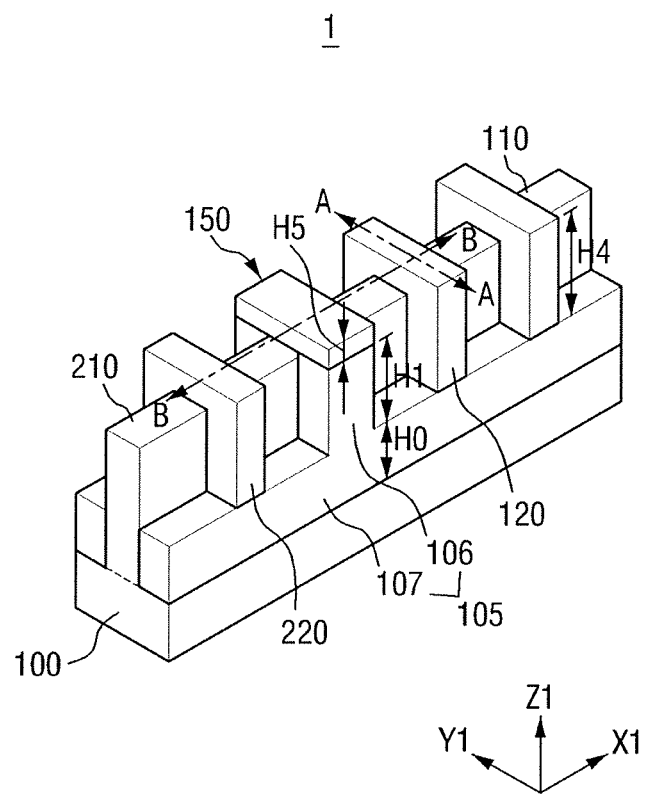
Figure 4:
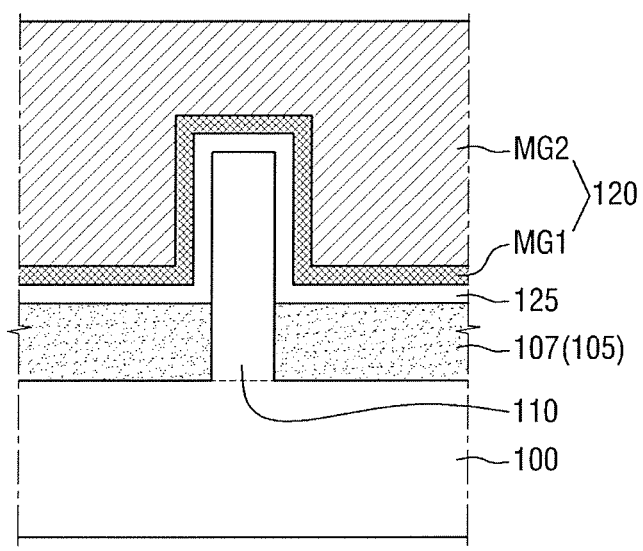
FIG. 4 is a cross-sectional view taken along line A-A of FIGS. 1 and 2, according to an exemplary embodiment of the present inventive concept.
Figure 5:
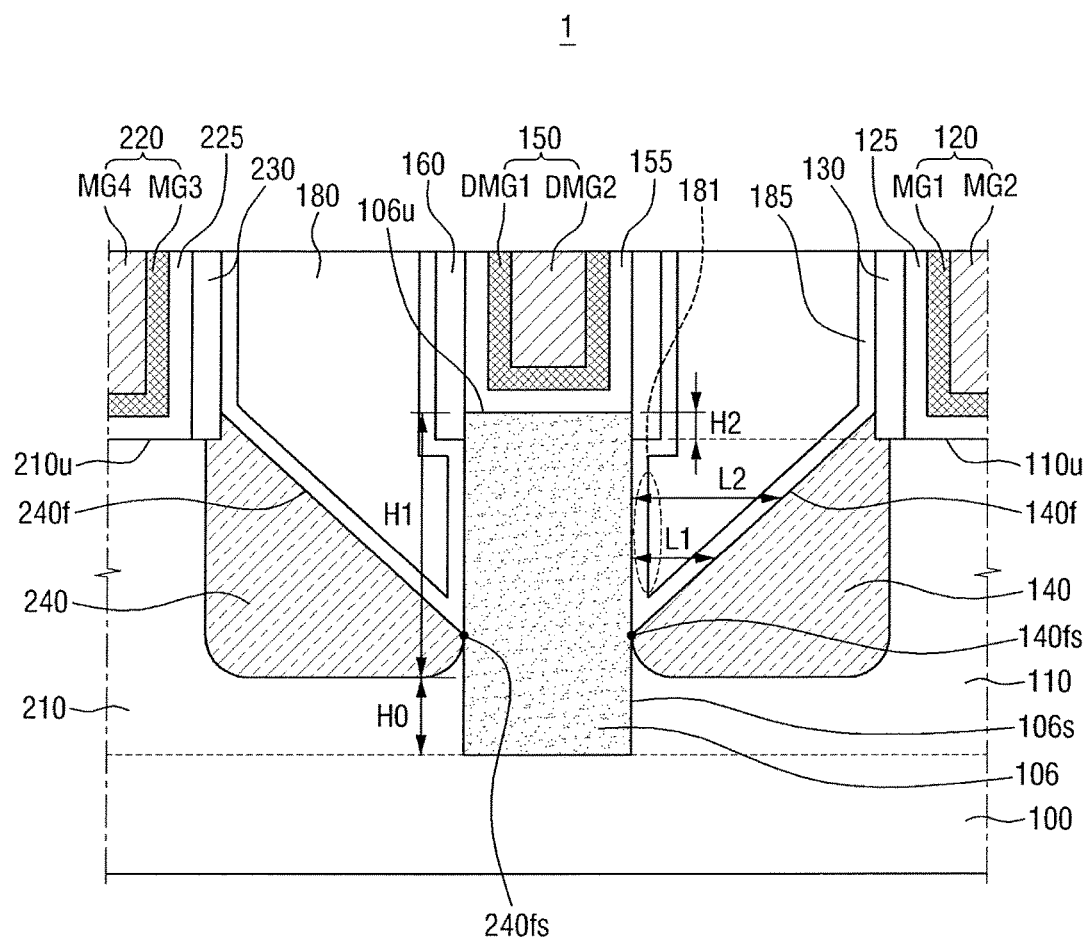
FIG. 5 is a cross-sectional view taken along line B-B of FIGS. 1 and 2, according to an exemplary embodiment of the present inventive concept.

Hereinafter, a semiconductor device according to an exemplary embodiment of the present inventive concept will be described with reference to FIGS. 1 to 5. FIGS. 1 and 2 are a layout view and a perspective view illustrating a semiconductor device according to an exemplary embodiment of the present inventive concept, FIG. 3 is a partial perspective view illustrating a multi-channel active pattern and a field insulation layer of the semiconductor device shown in FIGS. 1 and 2, according to an exemplary embodiment of the present inventive concept, FIG. 4 is a cross-sectional view taken along line A-A of FIGS. 1 and 2, according to an exemplary embodiment of the present inventive concept, and FIG. 5 is a cross-sectional view taken along line B-B of FIGS. 1 and 2, according to an exemplary embodiment of the present inventive concept.

Figure 3:
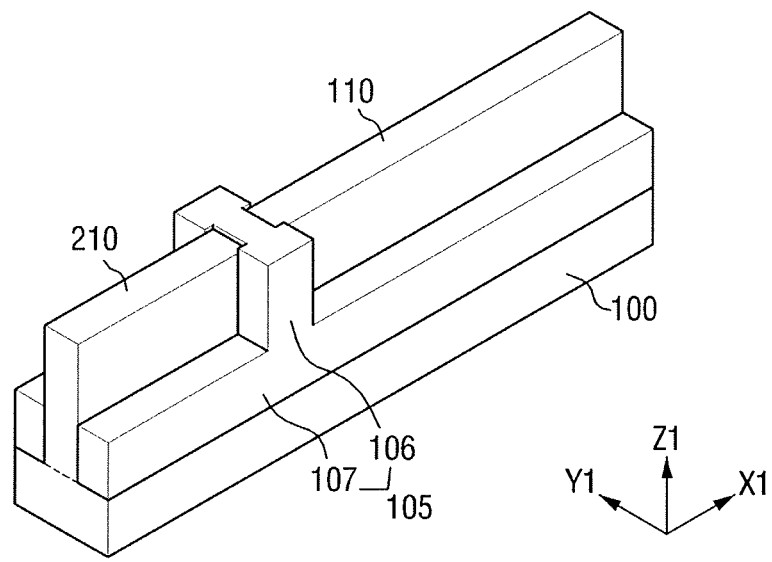
FIG. 3 is a partial perspective view illustrating a multi-channel active pattern and a field insulation layer of the semiconductor device shown in FIGS. 1 and 2, according to an exemplary embodiment of the present inventive concept.

A multi-channel active pattern shown in FIGS. 1 to 3 includes a source/drain formed thereon.

Referring to FIGS. 1 to 5, a semiconductor device 1 according to the current embodiment of the present inventive concept may include a first multi-channel active pattern 110, a second multi-channel active pattern 210, a first gate electrode 120, a second gate electrode 220, a field insulation layer 105, a first source/drain 140, a second source/drain 240 and a first dummy gate electrode 150 formed on a substrate 100.

The substrate 100 may be, for example, bulk silicon. Alternatively, the substrate 100 may be a silicon substrate, or a substrate made of other materials including, for example, germanium, silicon germanium, indium antimonide, a lead telluride compound, indium arsenide, indium phosphide, gallium arsenide, or gallium antimonide, but exemplary embodiments of the present inventive concept are not limited thereto. The substrate 100 may also be an epitaxial layer formed on a base substrate.

The first multi-channel active pattern 110 and the second multi-channel active pattern 210 may protrude from the substrate 100. The first multi-channel active pattern 110 and the second multi-channel active pattern 210 may extend lengthwise in a first direction X1. In the illustrated embodiment, the first multi-channel active pattern 110 and the second multi-channel active pattern 210 are disposed lengthwise in parallel with each other, but exemplary embodiments of the present inventive concept are not limited thereto.

Since the first multi-channel active pattern 110 and the second multi-channel active pattern 210 are lengthwise arranged in the first direction X1, they may include long sides extending in the first direction X1 and short sides extending in a second direction Y1, respectively.

Even if corners of the first multi-channel active pattern 110 and the second multi-channel active pattern 210 are round, the long sides can be discerned from the short sides.

In addition, the first multi-channel active pattern 110 and the second multi-channel active pattern 210 may be fin type active patterns or wire patterns. In the illustrated embodiment, fin type active patterns are shown as the first multi-channel active pattern 110 and the second multi-channel active pattern 210.

The first multi-channel active pattern 110 and the second multi-channel active pattern 210 are active patterns used for a multi-gate transistor. In other words, when the first multi-channel active pattern 110 and the second multi-channel active pattern 210 are fin type active patterns, channels may be connected to one another along three faces of the fin or channels may be formed on two opposed faces of the fin. Alternatively, when the first multi-channel active pattern 110 and the second multi-channel active pattern 210 are wire patterns, channels may be formed around the wire patterns.

The first multi-channel active pattern 110 and the second multi-channel active pattern 210 may be portions of the substrate 100 or may include epitaxial layers grown from the substrate 100. The first multi-channel active pattern 110 and the second multi-channel active pattern 210 may include, for example, an element semiconductor material, such as silicon or germanium. In addition, the first multi-channel active pattern 110 and the second multi-channel active pattern 210 may include compound semiconductors, for example, Group IV-IV compound semiconductors or Group III-V compound semiconductors.

Examples of the Group IV-IV compound semiconductors doped into the first multi-channel active pattern 110 and the second multi-channel active pattern 210 may include a binary compound or a ternary compound including at least two elements of carbon (C), silicon (Si), germanium (Ge), or tin (Sn), and compounds doped with Group IV elements.

The Group III-V compound semiconductor doped into the first multi-channel active pattern 110 and the second multi-channel active pattern 210 may include, for example, a binary compound, a ternary compound or a quaternary compound, prepared by combining at least one group III element of aluminum (Al), gallium (Ga) or indium (In) with at least one group V element of phosphorus (P), arsenic (As) or antimony (Sb).

In semiconductor devices according to exemplary embodiments of the present inventive concept, the first multi-channel active pattern 110 and the second multi-channel active pattern 210 will be described with regard to a case where they are Si-containing fin type active patterns. In other words, silicon fin type active patterns.

The field insulation layer 105 may be formed on the substrate 100 and may be disposed around the first multi-channel active pattern 110 and the second multi-channel active pattern 210. The field insulation layer 105 may be formed to surround portions of the first multi-channel active pattern 110 and the second multi-channel active pattern 210. In other words, the first multi-channel active pattern 110 and the second multi-channel active pattern 210 may be defined by the field insulation layer 105.

The field insulation layer 105 may include a first region 106 and a second region 107 having different heights. The height of the second region 107 of the field insulation layer 105 may be H0 and the height of the first region 106 of the field insulation layer 105 may be (H0+H1). In other words, a top surface 106u of the first region 106 of the field insulation layer 105 may be protruded upward from a top surface of the second region 107 of the field insulation layer 105. In addition, the top surface of the second region 107 of the field insulation layer 105 may be lower than a top surface 110u of the first multi-channel active pattern 110 and a top surface 210u of the second multi-channel active pattern 210.

Referring to FIGS. 2 and 3, in the semiconductor device 1 according to the current embodiment of the present inventive concept, the top surface 106u of the first region 106 of the field insulation layer 105 may be higher than the top surface 110u of the first multi-channel active pattern 110 and the top surface 210u of the second multi-channel active pattern 210. For example, FIGS. 2 and 3 illustrate a case in which the top surface 106u of the first region 106 of the field insulation layer 105 is positioned to be a height H2 (see FIG. 5) higher than the top surface 110u of the first multi-channel active pattern 110 and the top surface 210u of the second multi-channel active pattern 210.

For example, the first region 106 of the field insulation layer 105 may be formed to come in contact with short sides of the first multi-channel active pattern 110 and short sides of the second multi-channel active pattern 210, and the second region 107 of the field insulation layer 105 may be formed to come in contact with long sides of the first multi-channel active pattern 110 and long sides of the second multi-channel active pattern 210.

The first region 106 of the field insulation layer 105 may be formed under the first dummy gate electrode 150 and the second region 107 of the field insulation layer 105 may be formed under the first gate electrode 120 and the second gate electrode 220. In other words, the first region 106 of the field insulation layer 105 may be disposed between the first multi-channel active pattern 110 and the second multi-channel active pattern 210 facing each other.

The first region 106 of the field insulation layer 105 may be formed to extend lengthwise in the second direction Y1 and the second region 107 of the field insulation layer 105 may be formed to extend lengthwise in the first direction X1.

In FIG. 3, the field insulation layer 105 surrounding terminating ends of the first multi-channel active pattern 110 and the second multi-channel active pattern 210 is illustrated, but exemplary embodiments of the present inventive concept are not limited thereto. As shown in FIG. 3, when the field insulation layer 105 surrounds the terminating ends of the first multi-channel active pattern 110 and the second multi-channel active pattern 210, the field insulation layer 105 and the first dummy gate electrode 150 disposed on the field insulation layer 105 may be prevented from being misaligned.

The field insulation layer 105 may be, for example, an oxide layer, a nitride layer, an oxynitride layer, or a combination thereof.

The first gate electrode 120 may extend in the second direction Y1 and may cross the first multi-channel active pattern 110. The first gate electrode 120 may be disposed on the first multi-channel active pattern 110 and the field insulation layer 105, for example, the second region 107 of the field insulation layer 105.

The second gate electrode 220 may extend in the second direction Y1 and may cross the second multi-channel active pattern 210. The second gate electrode 220 may be disposed on the second multi-channel active pattern 210 and the field insulation layer 105, for example, the second region 107 of the field insulation layer 105. The second gate electrode 220 may be parallel with the first gate electrode 120.

The first dummy gate electrode 150 may extend in the second direction Y1 and may be disposed on the first region 106 of the field insulation layer 105. The first dummy gate electrode 150 may be singly formed on the first region 106 of the field insulation layer 105. Since one dummy gate electrode, rather than two or more dummy gate electrodes, is formed on the first region 106 of the field insulation layer 105, the size of a layout can be reduced.

The first gate electrode 120 may include metal layers MG1 and MG2. In other words, as shown in FIG. 4, the first gate electrode 120 may be formed by stacking two or more metal layers MG1 and MG2. The first metal layer MG1 may adjust a work function, and the second metal layer MG2 may fill a space formed by the first metal layer MG1. For example, the first metal layer MG1 may include at least one of TiN, TaN, TiC or TaC. In addition, the second metal layer MG2 may include W or Al. The first gate electrode 120 may be formed by, for example, a replacement process (or a gate last process), but exemplary embodiments of the present inventive concept are not limited thereto.

Like the first gate electrode 120, the second gate electrode 220 may include a third metal layer MG3 and a fourth metal layer MG4. A description of the second gate electrode 220 may be substantially the same as that of the first gate electrode 120. In other words, the third metal layer MG3 may correspond to the first metal layer MG1 and the fourth metal layer MG4 may correspond to the second metal layer MG2.

The first dummy gate electrode 150 may have substantially the same configuration as the first gate electrode 120 and the second gate electrode 220. As shown in FIG. 5, the first dummy gate electrode 150 may be formed by stacking two or more dummy metal layers DMG1 and DMG2. For example, the first dummy metal layer DMG1 may adjust a work function, and the second dummy metal layer DMG2 may fill a space foamed by the first dummy metal layer DMG1. The first dummy gate electrode 150 may include substantially the same material as the first gate electrode 120.

As described above, in FIGS. 2 and 5, the first region 106 of the field insulation layer 105 and the second region 107 of the field insulation layer 105 may have different heights. The height of the first region 106 of the field insulation layer 105 may be (H0+H1) and the height of the second region 107 of the field insulation layer 105 may be H0.

The top surface 106u of the first region 106 of the field insulation layer 105 may be positioned higher than a bottom surface of the first gate electrode 120 and a bottom surface of the second gate electrode 220. The first gate electrode 120 and the second gate electrode 220 may be formed along the second region 107 of the field insulation layer 105 and top surfaces and sidewalls of the first and second multi-channel active patterns 110 and 210. The term "bottom surfaces" of the first gate electrode 120 and the second gate electrode 220 may mean lowest parts of base planes of the first gate electrode 120 and the second gate electrode 220. In FIG. 2, a surface of the first or second gate electrodes 120 and 220 opposite to and facing the top surface of the second region 107 of the field insulation layer 105 may be the bottom surface.

In other words, the first and second gate electrodes 120 and 220 may further include a first surface facing the top surfaces 110u and 210u of the first and second multi-channel active patterns 110 and 210 and a second surface connected to the first surface facing the sidewalls of the first and second multi-channel active patterns 110 and 210. As shown in FIG. 2, the bottom surfaces of the first and second gate electrodes 120 and 220 may be the first surface.

In addition, the first dummy gate electrode 150 may have a different height from the first and second gate electrodes 120 and 220. A top surface of the first dummy gate electrode 150 may be parallel with top surfaces of the first and second gate electrodes 120 and 220. For example, in a case where the first dummy gate electrode 150 and the first and second gate electrodes 120 and 220 are subjected to planarization, top surfaces of the first dummy gate electrode 150 and the first and second gate electrodes 120 and 220 may be coplanar with each other.

In the semiconductor device 1 according to the current embodiment of the present inventive concept, the top surface 106$u$ of the first region 106 of the field insulation layer 105 is higher than the top surfaces 110$u$ and 210$u$ of the first and second multi-channel active patterns 110 and 210, the first dummy gate electrode 150 is formed on the first region 106 of the field insulation layer 105, and the first and second gate electrodes 120 and 220 are formed on the first and second multi-channel active patterns 110 and 210. On the cross-sectional view of FIG. 2 or 5, a height of the first dummy gate electrode 150 may be less than a height of the first or second gate electrode 120, 220.

Additionally, in FIG. 2, since the first and second gate electrodes 120 and 220 are formed on the second region 107 of the field insulation layer 105, the first dummy gate electrode 150 is formed on the first region 106 of the field insulation layer 105, and the top surface of the first region 106 of the field insulation layer 105 protrudes upward from the top surface of the second region 107 of the field insulation layer 105, a height H5 of the first dummy gate electrode 150 is less than a height H4 of the first or second gate electrode 120, 220.

A first gate insulation layer 125 may be formed between the first multi-channel active pattern 110 and the first gate electrode 120. The first gate insulation layer 125 may be formed on the field insulation layer 105, in other words, along the sidewall and top surface of first multi-channel active pattern 110 that protrudes upward from the second region 107 of the field insulation layer 105. In addition, the first gate insulation layer 125 may be disposed between the first gate electrode 120 and the second region 107 of the field insulation layer 105.

A second gate insulation layer 225 may be formed between the second multi-channel active pattern 210 and the second gate electrode 220. A description of the second gate insulation layer 225 may be substantially the same as that of the first gate insulation layer 125.

The first gate insulation layer 125 and the second gate insulation layer 225 may include a high-k material having a higher dielectric constant than silicon oxide. The first gate insulation layer 125 and the second gate insulation layer 225 may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but exemplary embodiments of the present inventive concept are not limited thereto.

A first dummy gate insulation layer 155 may be formed between the first region 106 of the field insulation layer 105 and the first dummy gate electrode 150. The first dummy gate insulation layer 155 may be formed along the top surface 106$u$ of the first region 106 of the field insulation layer 105. The first dummy gate insulation layer 155 may include substantially the same material as the first gate insulation layer 125.

A first gate spacer 130 may be disposed on a sidewall of the first gate electrode 120 extending in the second direction Y1. A second gate spacer 230 may be disposed on a sidewall of the second gate electrode 220 extending in the second direction Y1. The first spacer 160 may be disposed on a sidewall of the first dummy gate electrode 150 extending in the second direction Y1.

The first gate spacer 130, the second gate spacer 230 and the first spacer 160 may include, for example, silicon nitride (SiN), silicon oxynitride (SiON), silicon oxide (SiO$_2$), silicon oxycarbonitride (SiOCN) or combinations thereof.

The first source/drain 140 may be disposed between the first gate electrode 120 and the first region 106 of the field insulation layer 105 and may be formed on the first multi-channel active pattern 110. The first source/drain 140 may contact the first region 106 of the field insulation layer 105 (for example, a sidewall 106$s$). The first source/drain 140 may include an epitaxial layer.

The first source/drain 140 may include a first facet 140$f$. The first facet 140$f$ may start from the first region 106 of the field insulation layer 105, which is lower than the top surface 110$u$ of the first multi-channel active pattern 110 and the top surface 106$u$ of the first region 106 of the field insulation layer 105.

In other words, a starting point 140$fs$ of the first facet 140$f$ may be lower than the top surface 110$u$ of the first multi-channel active pattern 110 and the top surface 106$u$ of the first region 106 of the field insulation layer 105. In addition, since the first source/drain 140 is in contact with the first region 106 of the field insulation layer 105, the starting point 140$fs$ of the first facet 140$f$ may be included in (or at) the sidewall 106$s$ of the first region 106 of the field insulation layer 105.

The starting point 140$fs$ of the first facet 140$f$ may be the bottommost part of the first facet 140$f$.

On the cross-sectional view of FIG. 5, the sidewall 106$s$ of the first region 106 of the field insulation layer 105 may include a first spot close to the starting point 140$fs$ of the first facet 140$f$ and a second spot farther from the starting point 140$fs$ of the first facet 104$f$ than the first spot. Here, a distance L1 ranging from the first spot to the first facet 140$f$ positioned at the same level with the first spot may be less than a distance L2 ranging from the second spot to the first facet 140$f$ positioned at the same level with the second spot.

In addition, a portion of the first region 106 of the field insulation layer 105, which is farther from the substrate 100 than the starting point 140$fs$ of the first facet 140$f$ (for example, closer to the bottom of the first dummy gate electrode 150) may not come in contact with a semiconductor material, for example, the first multi-channel active pattern 110 or the first source/drain 140. In other words, material that is the same as the semiconductor material, for example, that which forms the first multi-channel active pattern 110, may not be provided in an area between the first facet 140$f$ and the sidewall 106$s$ of the first region 106 of the field insulation layer 105.

Additionally, the starting point 140$fs$ of the first facet 140$f$ may contact the first multi-channel active pattern 110. Therefore, in the semiconductor device 1 according to the current embodiment of the present inventive concept, the first source/drain 140 may not include an interfacial surface extending along the sidewall 106s of the first region 106 of the field insulation layer 105.

In FIG. 5, at least a portion of the first spacer 160 may laterally protrude from the sidewall 106s of the first region 106 of the field insulation layer 105. Therefore, that portion of the first spacer 160 may overlap with the first source/drain 140.

In addition, the first source/drain 140 may come in contact with the first gate spacer 130. Therefore, a height of a portion of the first source/drain 140 coming in contact with the first gate spacer 130 may be greater than a height of a bottom surface of the first gate spacer 130.

The second source/drain 240 may be disposed between the second gate electrode 220 and the first region 106 of the field insulation layer 105 and may be formed on the second multi-channel active pattern 210. The second source/drain 240 may contact the first region 106 of the field insulation layer 105. The second source/drain 240 may include an epitaxial layer.

The first source/drain 140 and the second source/drain 240 may be disposed at opposite sides of the first region 106 of the field insulation layer 105.

The second source/drain 240 may include a second facet 240f. The second facet 240f may start from the first region 106 of the field insulation layer 105, which is lower than the top surface 210u of the second multi-channel active pattern 210 and the top surface 106u of the first region 106 of the field insulation layer 105.

On the cross-sectional view of FIG. 5, a description of a configuration of the second source/drain 240 may be substantially the same as that of the configuration of the first source/drain 140. For example, a starting point 240fs of the second facet 240f may be the bottommost part of the second facet 240f.

In FIG. 5, at least a portion of the first spacer 160 may laterally protrude from the sidewall 106s of the first region 106 of the field insulation layer 105. Therefore, that portion of the first spacer 160 may overlap with the second source/drain 240.

In the semiconductor device 1 according to the current embodiment of the present inventive concept, the first source/drain 140 and the second source/drain 240 may not be shared sources/drains connected to two channel regions between two gate electrodes.

When the semiconductor device 1 according to the current embodiment of the present inventive concept is a p-type metal oxide semiconductor (PMOS) transistor, the first source/drain 140 and the second source/drain 240 may include a compressive stress material. For example, the compressive stress material may be a material having a larger lattice constant than silicon (Si), for example, SiGe. The compressive stress material may make carriers in a channel region more mobile by applying a compressive stress to the first multi-channel active pattern 110.

Alternatively, when the semiconductor device 1 according to the currently embodiment of the present inventive concept is an n-type metal oxide semiconductor (NMOS) transistor, the first source/drain 140 and the second source/drain 240 may include a tensile stress material. For example, when the first multi-channel active pattern 110 and the second multi-channel active pattern 210 include Si, the first source/drain 140 and the second source/drain 240 may include Si or a material having a smaller lattice constant than Si (e.g., SiC). For example, the tensile stress material may make carriers in a channel region more mobile by applying a tensile stress to the first multi-channel active pattern 110.

An etch stop layer 185 may be formed on the first source/drain 140 and the second source/drain 240. For example, the etch stop layer 185 may be formed along the first facet 140f of the first source/drain 140, the second facet 240f of the second source/drain 240 and the sidewall 106s of the first region 106 of the field insulation layer 105.

At least a portion of a bottom surface of the first spacer 160 may contact the etch stop layer 185.

The etch stop layer 185 may include, for example, silicon nitride (SiN), silicon oxynitride (SiON), silicon oxide (SiO$_2$), silicon oxycarbonitride (SiOCN) or combinations thereof.

An interlayer insulation layer 180 may be formed on the first source/drain 140, the second source/drain 240 and the etch stop layer 185. In addition, the interlayer insulation layer 180 may be formed to surround the first gate electrode 120, the second gate electrode 220 and the first dummy gate electrode 150.

As described above, the first spacer 160 disposed on opposite sidewalls of the first dummy gate electrode 150 may overlap with the first source/drain 140 and the second source/drain 240. In addition, the sidewall 106s of the first region 106 of the field insulation layer 105, which is farther from the substrate 100 than a starting point 140fs of the first facet 140f and the starting point 240fs of the second facet 240f, may not contact the semiconductor material.

In other words, the semiconductor material may not be provided between the first spacer 160 and a region of the first source/drain 140 overlapping with the first spacer 160, and the semiconductor material may not be provided between the first spacer 160 and a region of the second source/drain 240 overlapping with the first spacer 160.

Therefore, an insulating material may be provided between the first spacer 160 and the region of the first source/drain 140 overlapping with the first spacer 160 and between the first spacer 160 and the region of the second source/drain 240 overlapping with the first spacer 160.

In other words, a first insulation pattern 181 including the etch stop layer 185 and/or the interlayer insulation layer 180 may be disposed between the first spacer 160 and the region of the first source/drain 140 overlapping with the first spacer 160 and between the first spacer 160 and the region of the second source/drain 240 overlapping with the first spacer 160.

Additionally, the sidewall 106s of the first region 106 of the field insulation layer 105, which is farther from the substrate 100 than the starting point 140fs of the first facet 140f and the starting point 240fs of the second facet 240f, may be covered by the first insulation pattern 181.

The interlayer insulation layer 180 may include, for example, a silicon oxide layer, a silicon nitride layer, a silicon oxynitride layer or a low-k material layer. The low-k material may include, for example, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, a polyimide, a porous polymeric material, or combinations thereof, but exemplary embodiments of the present inventive concept are not limited thereto.

The first insulation pattern 181 is interposed between the first dummy gate electrode 150 formed on the first region 106 of the field insulation layer 105 and the first source/drain 140 and between the first dummy gate electrode 150 and the second source/drain 240, thereby reducing leakage current occurring between the first dummy gate electrode 150 and each of the first and second sources/drains 140 and 240. Accordingly, the operating performance and reliability of the semiconductor device 1 can be increased.

Figure 6:
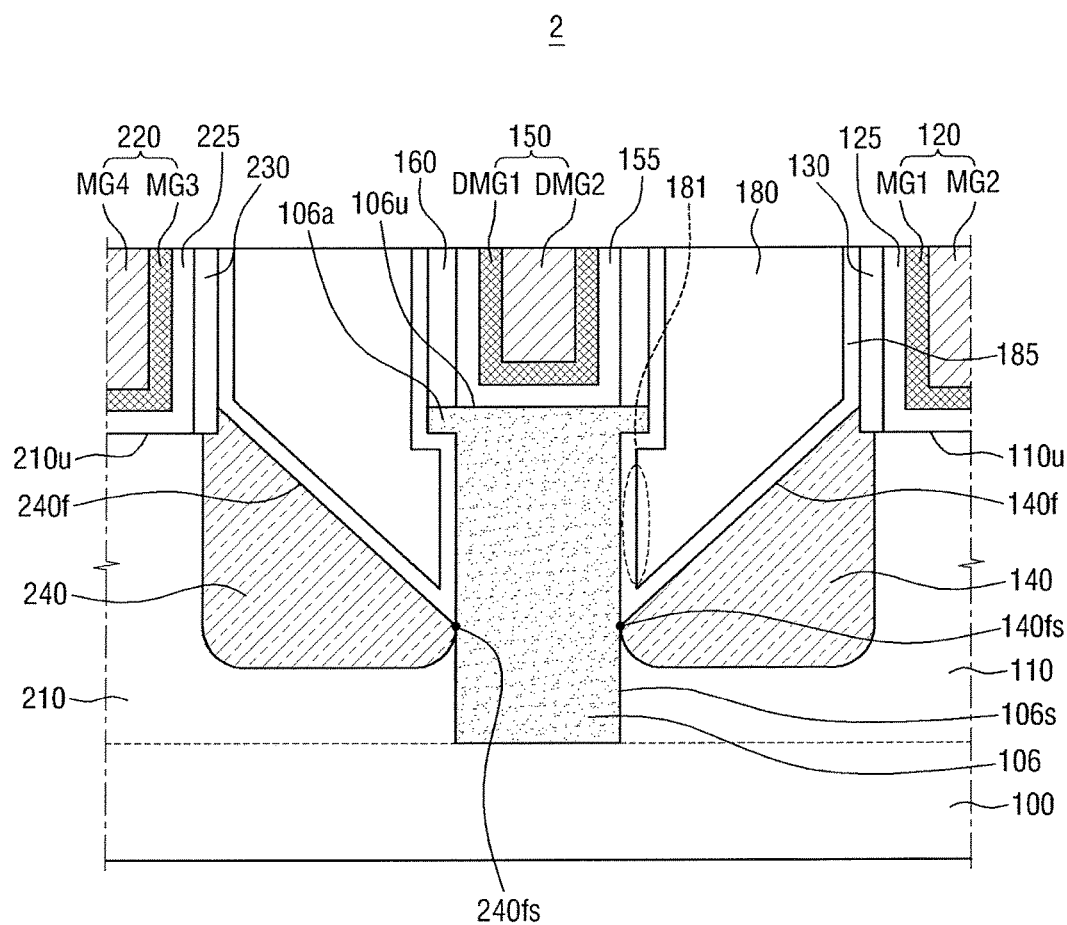
FIG. 6 is a cross-sectional view illustrating a semiconductor device according to an exemplary embodiment of the present inventive concept.
Figure 7:
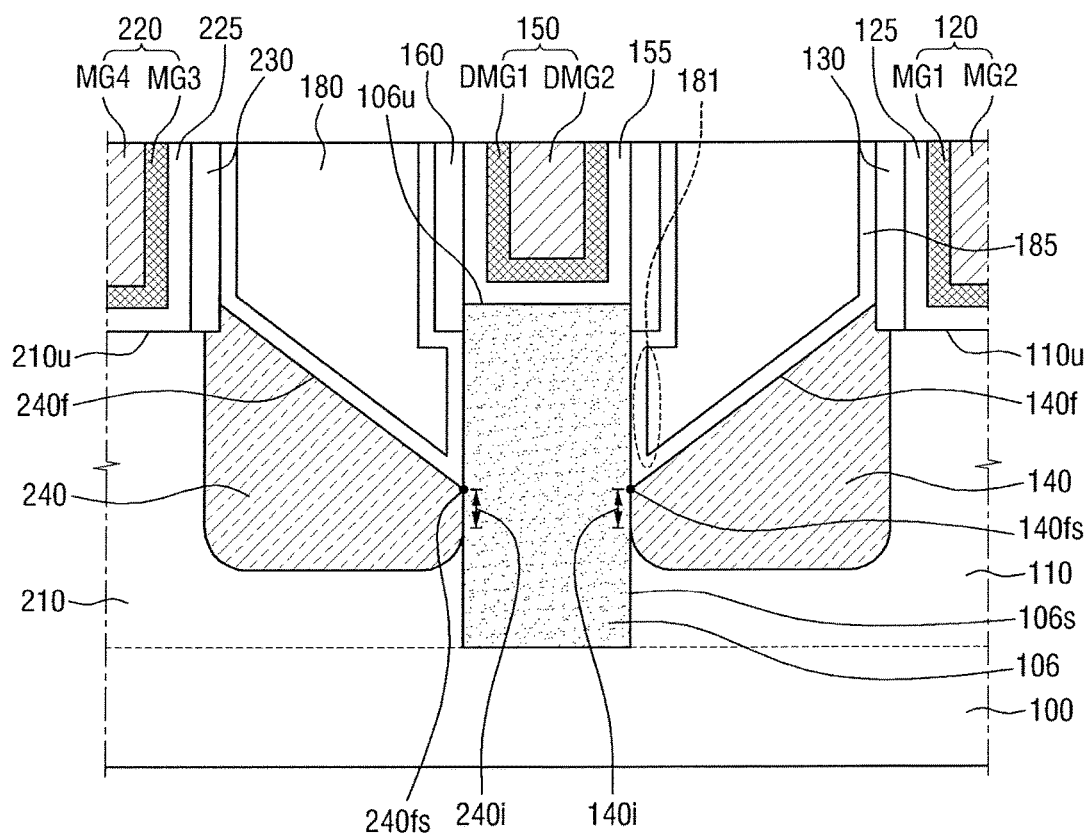
FIG. 7 is a cross-sectional view illustrating a semiconductor device according to an exemplary embodiment of the present inventive concept.
Figure 8:
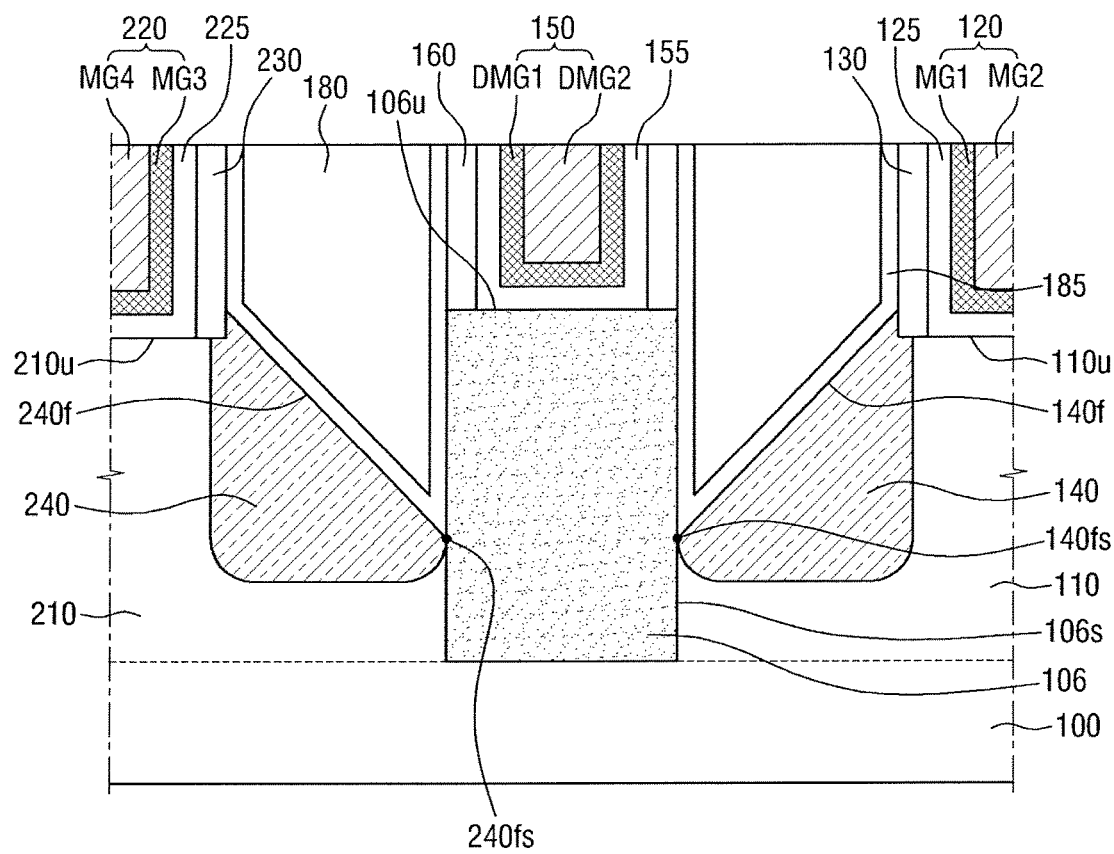
FIG. 8 is a cross-sectional view illustrating a semiconductor device according to an exemplary embodiment of the present inventive concept.
Figure 9A:
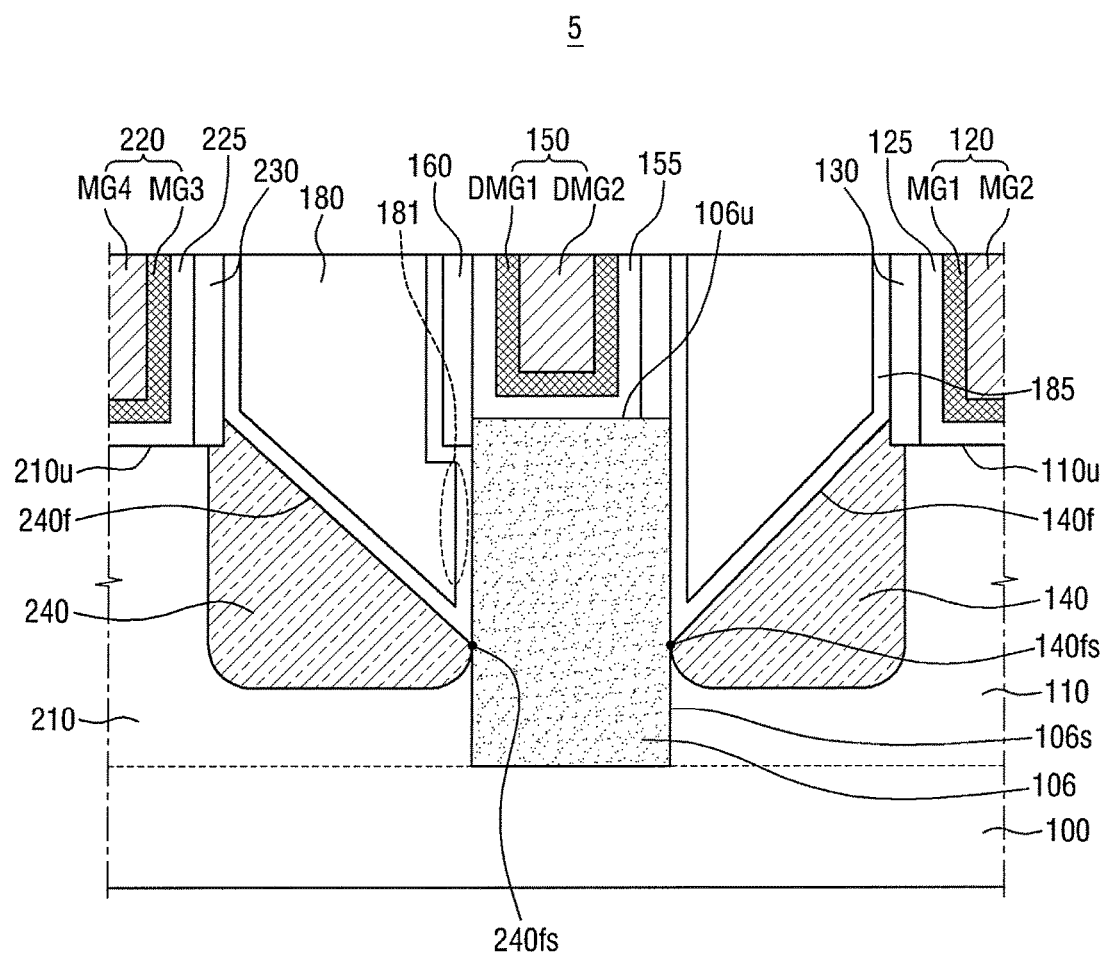
FIG. 9A is a cross-sectional view illustrating a semiconductor device according to an exemplary embodiment of the present inventive concept and FIGS. 9B and 9C are cross-sectional views illustrating modified examples of the semiconductor device shown in FIG. 9A.
Figure 9B:
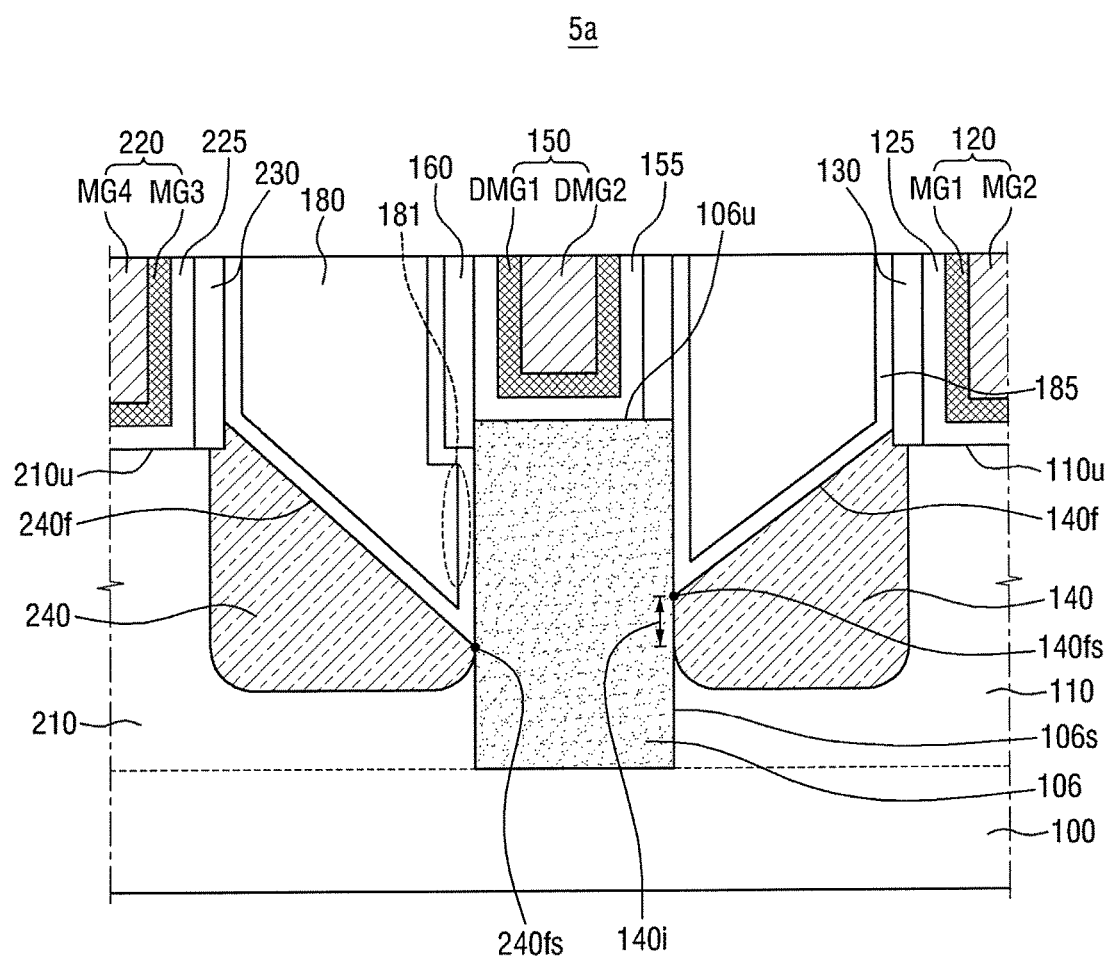
Figure 9C:
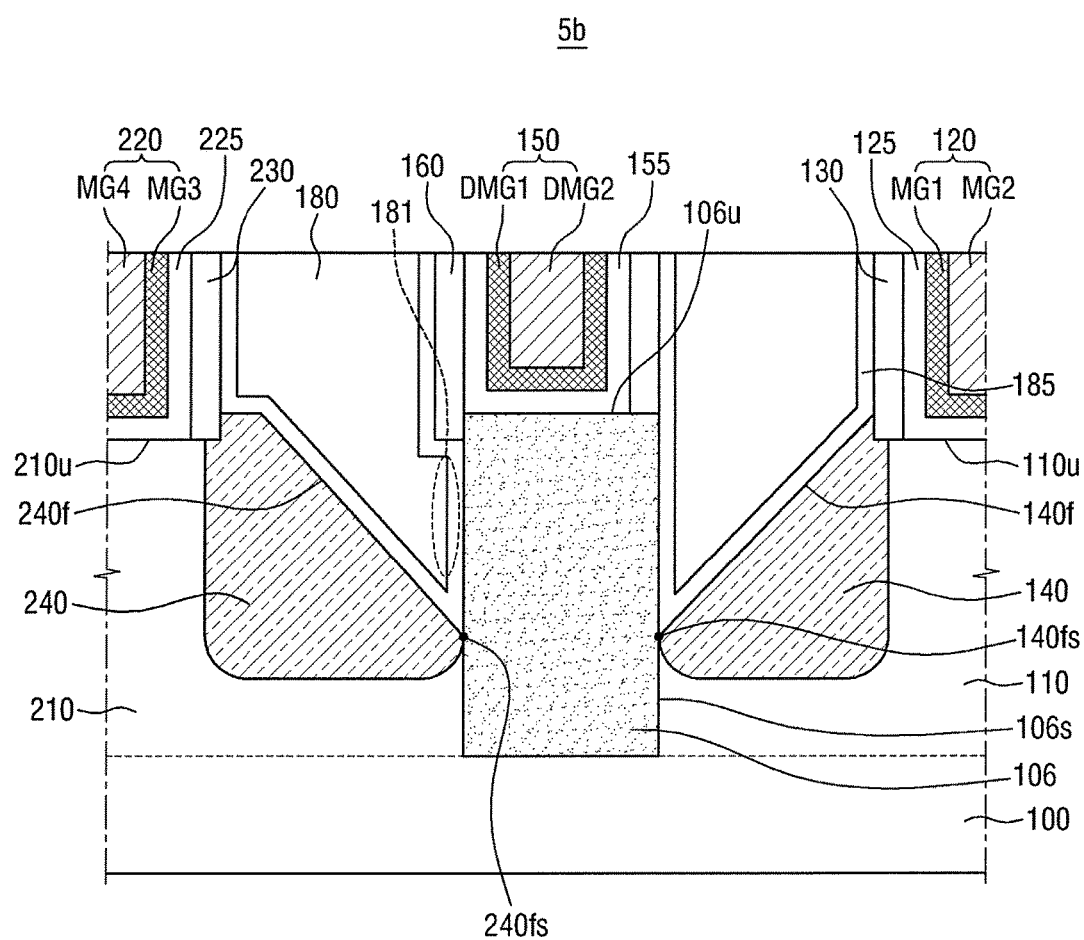

FIG. 6 is a cross-sectional view illustrating a semiconductor device according to an exemplary embodiment of the present inventive concept, FIG. 7 is a cross-sectional view illustrating a semiconductor device according to an exemplary embodiment of the present inventive concept, FIG. 8 is a cross-sectional view illustrating a semiconductor device according to an exemplary embodiment of the present inventive concept, FIG. 9A is a cross-sectional view illustrating a semiconductor device according to an exemplary embodiment of the present inventive concept and FIGS. 9B and 9C are cross-sectional views illustrating modified examples of the semiconductor device shown in FIG. 9A. For the sake of brevity, elements and features that are substantially the same as those shown and described with reference FIGS. 1 to 5 may not be described.

In the embodiment shown in FIGS. 9A to 9C and modifications thereof, a first dummy gate electrode 150 is misaligned with a first region 106 of a field insulation layer 105.

Referring to FIG. 6, in a semiconductor device 2 according to an exemplary embodiment of the present inventive concept, the first region 106 of the field insulation layer 105 may include a protrusion part 106a overlapping with a first source/drain 140 and/or a second source/drain 240.

The protrusion part 106a may laterally protrude from a sidewall 106s of the first region 106 of the field insulation layer 105.

On the cross-sectional view shown in FIG. 6, the first region 106 of the field insulation layer 105 may include an upper portion and a lower portion, and the upper portion of the first region 106 of the field insulation layer 105 may include the protrusion part 106a, and the lower portion of the first region 106 of the field insulation layer 105 may include a starting point 140fs of a first facet 140f and a starting point 240fs of a second facet 240f.

A first spacer 160 disposed on opposite sidewalls of a first dummy gate electrode 150 may be formed on a top surface 106u of the first region 106 of the field insulation layer 105. Therefore, since a bottom surface of the first spacer 160 faces the top surface 106u of the first region 106 of the field insulation layer 105, the bottom surface of the first spacer 160 may not contact an etch stop layer 185.

Since the protrusion part 106a overlaps with the first source/drain 140 and/or the second source/drain 240, a first insulation pattern 181 may be disposed between the protrusion part 106a and a region of the first source/drain 140 overlapping with the protrusion part 106a and/or the protrusion part 106a and a region of the second source/drain 240 overlapping with the protrusion part 106a.

Referring to FIG. 7, in a semiconductor device 3 according to an exemplary embodiment of the present inventive concept, the first source/drain 140 may include a first interfacial surface 140i extending along a sidewall 106s of the first region 106 of the field insulation layer 105.

In addition, the second source/drain 240 may include a second interfacial surface 240i extending along the sidewall 106s of the first region 106 of the field insulation layer 105. Accordingly, the starting point 140fs of the first facet 140f and the starting point 240fs of the second facet 240f may not come in contact with the first and second multi-channel active patterns 110 and 210.

On the sidewall 106s of the first region 106 of the field insulation layer 105, the first interfacial surface 140i may extend from the starting point 140fs of the first facet 140f to the first multi-channel active pattern 110 and the second interfacial surface 240i may extend from the starting point 240fs of the second facet 240f to the second multi-channel active pattern 210.

Referring to FIG. 8, in a semiconductor device 4 according to an exemplary embodiment of the present inventive concept, the first spacer 160 disposed on opposite sidewalls of the first dummy gate electrode 150 may be formed on the top surface 106u of the first region 106 of the field insulation layer 105.

In other words, the first spacer 160 may not laterally protrude from the sidewall 106s of the first region 106 of the field insulation layer 105. The first spacer 160 having its sidewalls aligned with the sidewall 106s of the first region 106 of the field insulation layer 105 is illustrated in FIG. 8, but exemplary embodiments of the present inventive concept are not limited thereto.

Accordingly, since a bottom surface of the first spacer 160 faces a top surface 106u of the first region 106 of the field insulation layer 105, the bottom surface of the first spacer 160 may not contact the etch stop layer 185.

The bottom surface of the first spacer 160 may not overlap with the first source/drain 140 and the second source/drain 240. Therefore, a portion of the interlayer insulation layer 180 and/or the etch stop layer 185 may not be interposed between the first spacer 160 and the first source/drain 140 and between the first spacer 160 and the second source/drain 240.

Referring to FIG. 9A, in a semiconductor device 5 according to an exemplary embodiment of the present inventive concept, a first spacer 160 adjacent to a first gate electrode 120 may not laterally protrude from a sidewall 106s of a first region 106 of a field insulation layer 105, while a first spacer 160 adjacent to a second gate electrode 220 may laterally protrude from the sidewall 106s of the first region 106 of the field insulation layer 105.

In other words, since a bottom surface of the first spacer 160 adjacent to the first gate electrode 120 faces a top surface 106u of the first region 106 of the field insulation layer 105, it may not overlap with the first source/drain 140.

However, at least a portion of the bottom surface of the first spacer 160 adjacent to the second gate electrode 220 may overlap with the second source/drain 240.

Accordingly, a portion of an interlayer insulation layer 180 and/or an etch stop layer 185 may not be interposed between the first spacer 160 adjacent to the first gate electrode 120 and the first source/drain 140.

However, a first insulation pattern 181 may be interposed between the first spacer 160 and a region of the second source/drain 240 overlapping with the first spacer 160.

Referring to FIG. 9B, in a semiconductor device 5a according to an exemplary embodiment of the present inventive concept, a first source/drain 140 may include a first interfacial surface 140i extending along the sidewall 106s of the first region 106 of the field insulation layer 105.

However, the second source/drain 240 may not include an interfacial surface extending along the sidewall 106s of the first region 106 of the field insulation layer 105.

Unlike that shown in FIG. 9B, the second source/drain 240 may include an interfacial surface extending along the sidewall 106s of the first region 106 of the field insulation layer 105, while the first source/drain 140 may not include an interfacial surface extending along the sidewall 106s of the first region 106 of the field insulation layer 105.

Referring to FIG. 9C, in a semiconductor device 5b according to an exemplary embodiment of the present inventive concept, a second facet 240f of a second source/drain 240 may have facet parts having different slopes.

For example, on the cross-sectional view of FIG. 9C taken along the direction in which a first multi-channel active pattern 110 and a second multi-channel active pattern 210 extend lengthwise, the second facet 240f of the second source/drain 240 may include a lower portion having a first slope and an upper portion having a second slope different from the first slope.

Unlike that shown in FIG. 9C, a first facet 140f, rather than the second facet 240f, may have facet parts having different slopes.

Figure 10:
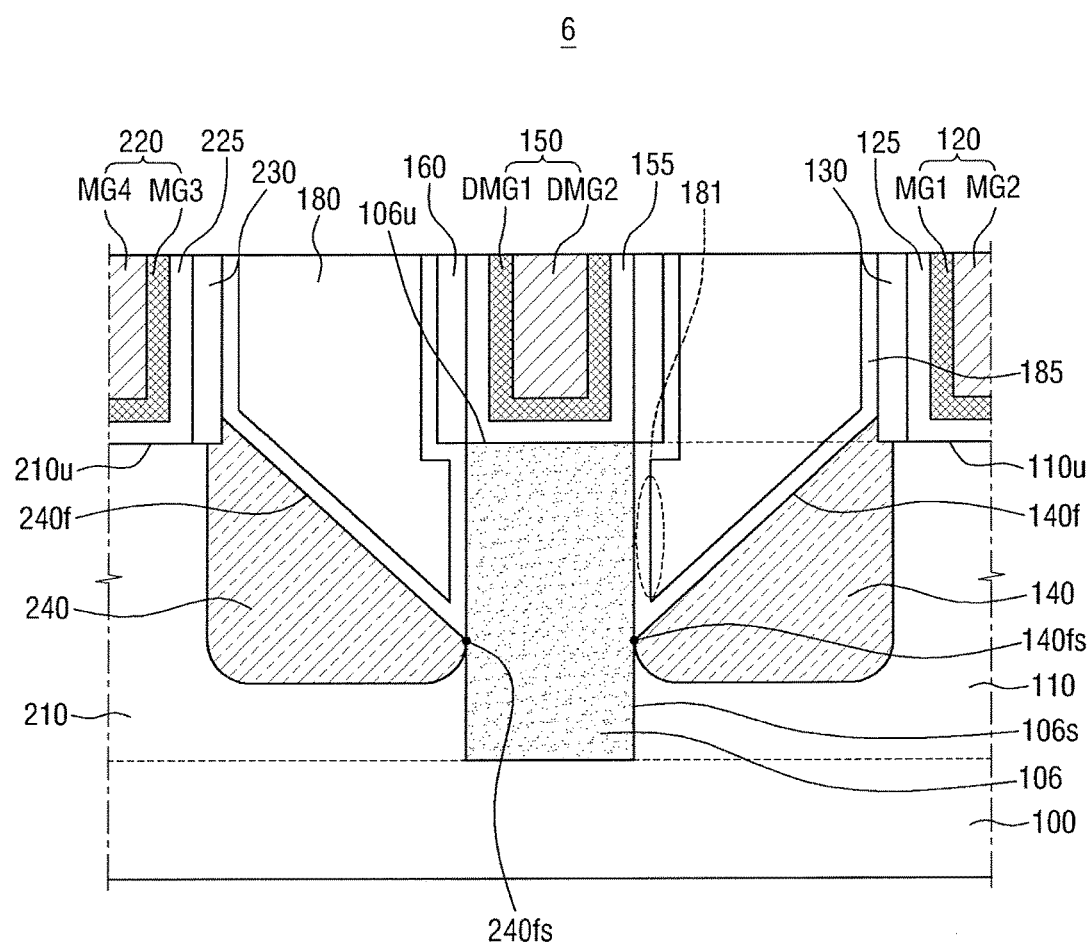
FIG. 10 is a cross-sectional view illustrating a semiconductor device according to an exemplary embodiment of the present inventive concept.

FIG. 10 is a cross-sectional view illustrating a semiconductor device according to an exemplary embodiment of the present inventive concept. For the sake of brevity, elements and features that are substantially the same as those shown and described with reference to FIGS. 1 to 5 may not be described.

Referring to FIG. 10, in a semiconductor device 6 according to an exemplary embodiment of the present inventive concept, a top surface 106u of a first region 106 of a field insulation layer 105 may be positioned to be coplanar with a top surface 110u of a first multi-channel active pattern 110 and a top surface 210u of a second multi-channel active pattern 210.

Accordingly, on the first and second multi-channel active patterns 110 and 210, a height of the first or second gate electrode 120, 220 may be substantially the same as a height of a first dummy gate electrode 150 formed on the first region 106 of the field insulation layer 105.

However, as described above, the first and second gate electrodes 120 and 220 are formed on a second region 107 of the field insulation layer 105, the first dummy gate electrode 150 is formed on the first region 106 of the field insulation layer 105, and a top surface of the first region 106 of the field insulation layer 105 protrudes upward from a top surface of the second region 107 of the field insulation layer 105. Accordingly, the overall height of the first dummy gate electrode 150 may be less than the overall height of the first or second gate electrode 120, 220.

Figure 11:
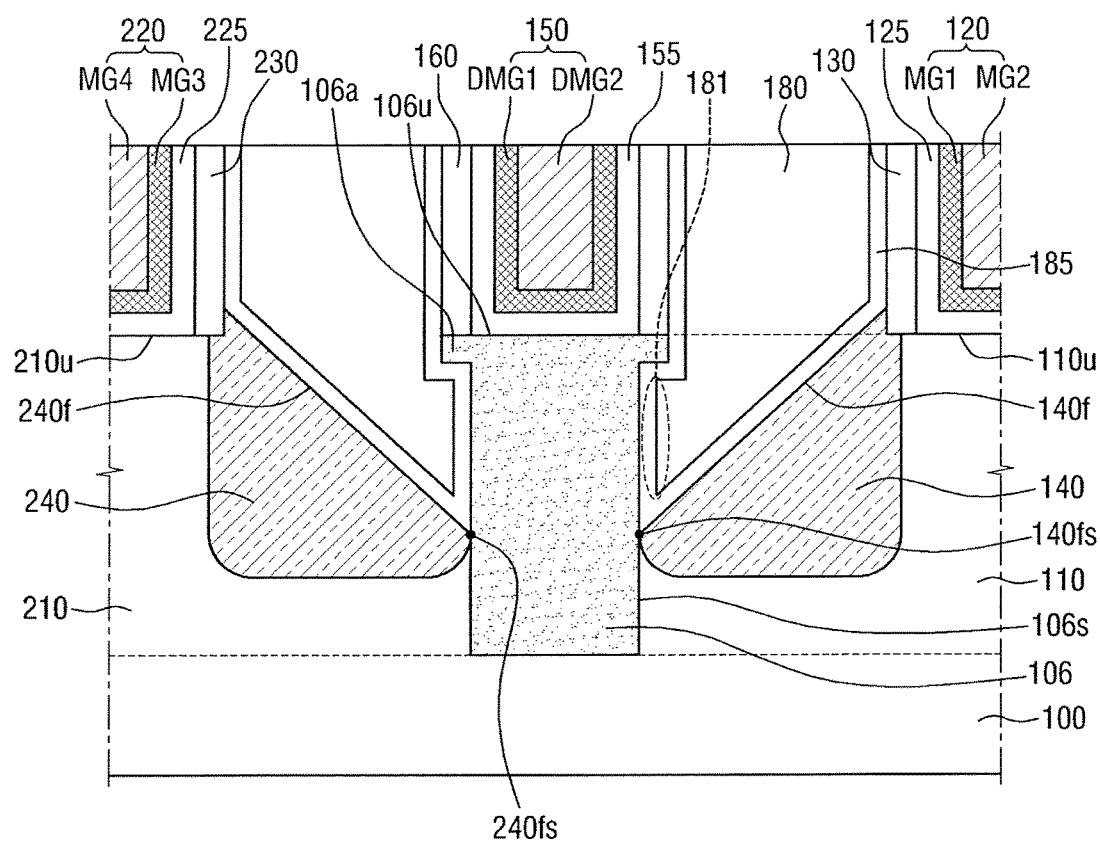
FIG. 11 is a cross-sectional view illustrating a semiconductor device according to an exemplary embodiment of the present inventive concept.

FIG. 11 is a cross-sectional view illustrating a semiconductor device according to an exemplary embodiment of the present inventive concept. For the sake of brevity, elements and features that are substantially the same as those shown and described with reference to FIG. 10 may not be described.

Referring to FIG. 11, in a semiconductor device 7 according to an exemplary embodiment of the present inventive concept, a first region 106 of a field insulation layer 105 may include a protrusion part 106a overlapping a first source/drain 140 and/or a second source/drain 240.

The protrusion part 106a may laterally protrude from a sidewall 106s of a first region 106 of a field insulation layer 105. Since a top surface 106u of the first region 106 of the field insulation layer 105 is positioned to be coplanar with a top surface 110u of a first multi-channel active pattern 110 and a top surface 210u of a second multi-channel active pattern 210, a height of the protrusion part 106a may be equal to or less than a height of the top surface 110u of the first multi-channel active pattern 110 or the top surface 210u of the second multi-channel active pattern 210.

On the cross-sectional view of FIG. 11, the first region 106 of the field insulation layer 105 may include an upper portion and a lower portion. The upper portion of the first region 106 of the field insulation layer 105 may include the protrusion part 106a, and the lower portion of the first region 106 of the field insulation layer 105 may include a starting point 140fs of a first facet 140f and a starting point 240fs of a second facet 240f.

A first spacer 160 disposed on opposite sidewalls of a first dummy gate electrode 150 may be formed on the top surface 106u of the first region 106 of the field insulation layer 105. Therefore, since a bottom surface of the first spacer 160 faces the top surface 106u of the first region 106 of the field insulation layer 105, the bottom surface of the first spacer 160 may not contact an etch stop layer 185.

Since the protrusion part 106a overlaps with the first source/drain 140 and/or the second source/drain 240, a first insulation pattern 181 may be disposed between the protrusion part 106a and a region of the first source/drain 140 overlapping with the protrusion part 106a and/or the protrusion part 106a and a region of the second source/drain 240 overlapping with the protrusion part 106a.

Figure 12:
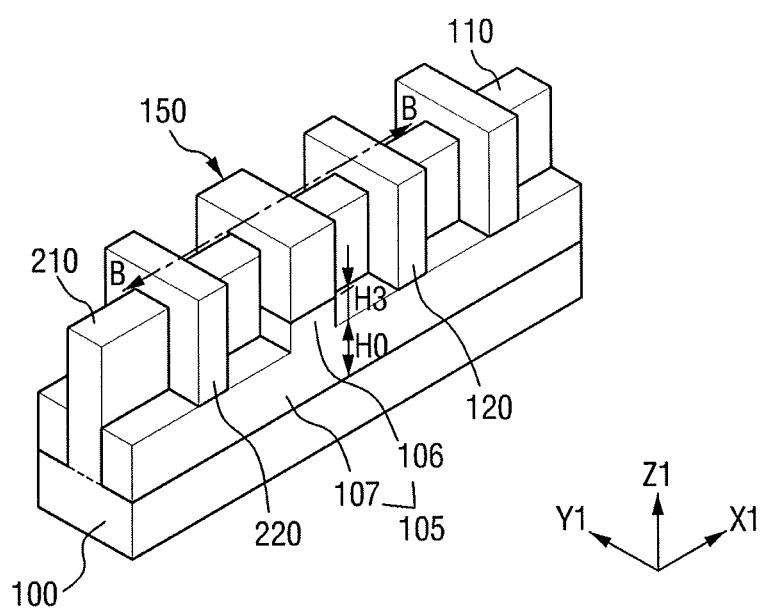
FIG. 12 is a cross-sectional view illustrating a semiconductor device according to an exemplary embodiment of the present inventive concept.
Figure 13:
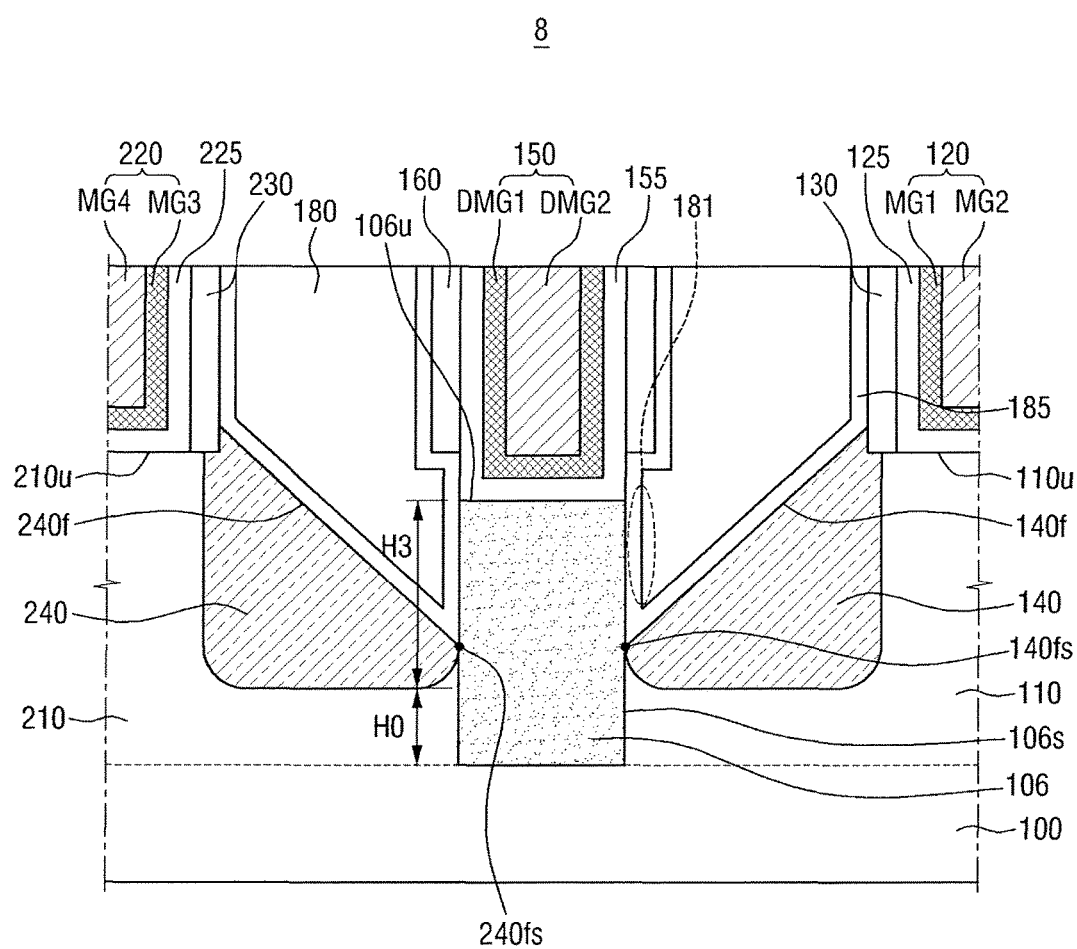
FIG. 13 is a cross-sectional view taken along line B-B of FIG. 12, according to an exemplary embodiment of the present inventive concept.

FIG. 12 is a cross-sectional view illustrating a semiconductor device according to an exemplary embodiment of the present inventive concept and FIG. 13 is a cross-sectional view taken along line B-B of FIG. 12, according to an exemplary embodiment of the present inventive concept. For the sake of brevity, elements and features substantially the same as those shown and described with reference to FIGS. 1 to 5 may not be described.

Referring to FIGS. 12 and 13, in a semiconductor device 8 according to an exemplary embodiment of the present inventive concept, a top surface 106u of a first region 106 of a field insulation layer 105 may be lower than a top surface 110u of a first multi-channel active pattern 110 and a top surface 210u of a second multi-channel active pattern 210.

The field insulation layer 105 may include the first region 106 and a second region 107 having different heights. The height of the second region 107 of the field insulation layer 105 may be H0 and the height of the first region 106 of the field insulation layer 105 may be (H0+H3). The height (H0+H3) of the first region 106 of the field insulation layer 105 may be less than the height (H0+H1) of the first region 106 of the field insulation layer 105, as shown in FIG. 2.

Accordingly, on the first and second multi-channel active patterns 110 and 210, a height of the first or second gate electrode 120, 220 may be substantially the same as a height of a first dummy gate electrode 150 formed on the first region 106 of the field insulation layer 105.

However, as described above, the first and second gate electrodes 120 and 220 are formed on the second region 107 of the field insulation layer 105, the first dummy gate electrode 150 is formed on the first region 106 of the field insulation layer 105, and a top surface of the first region 106 of the field insulation layer 105 protrudes upward from a top surface of the second region 107 of the field insulation layer 105. Accordingly, the overall height of the first dummy gate electrode 150 may be less than the overall height of the first or second gate electrode 120, 220.

On the cross-sectional view of FIG. 13, the height of the first dummy gate electrode 150 may be greater than a height of a first spacer 160. For example, the first dummy gate electrode 150 is longer than the first spacer 160 in the view of FIG. 13. Therefore, a portion of the first dummy gate insulation layer 155 formed between the first dummy gate electrode 150 and the first region 106 of the field insulation layer 105 may not be covered by the first spacer 160.

Accordingly, a portion of the sidewall of the first dummy gate insulation layer 155, which is not covered by the first spacer 160, may be covered by an interlayer insulation layer 180 and an etch stop layer 185.

Figure 14:
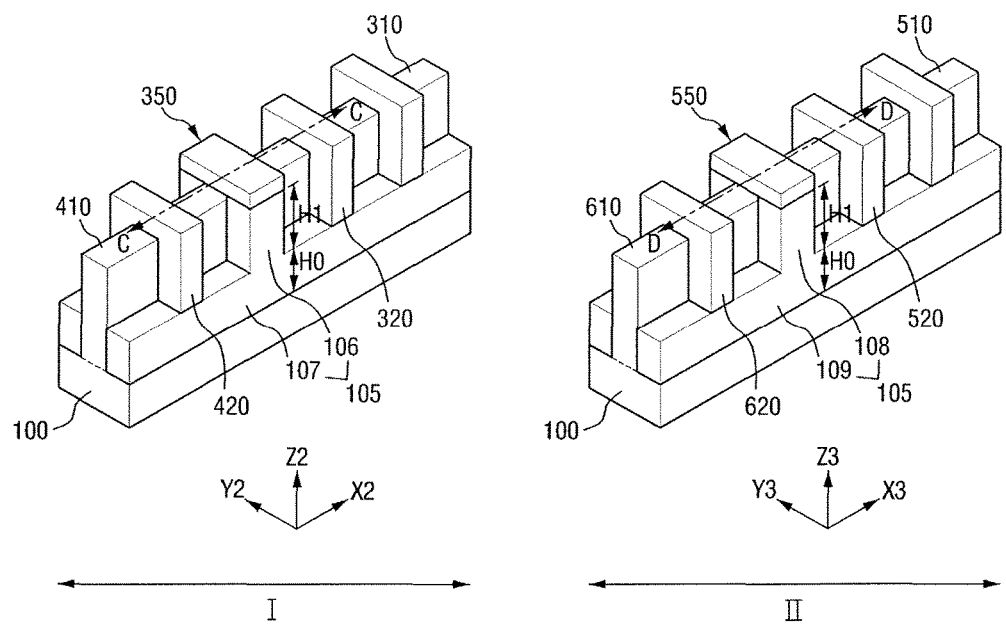
FIG. 14 is a cross-sectional view illustrating a semiconductor device according to an exemplary embodiment of the present inventive concept.
Figure 15:
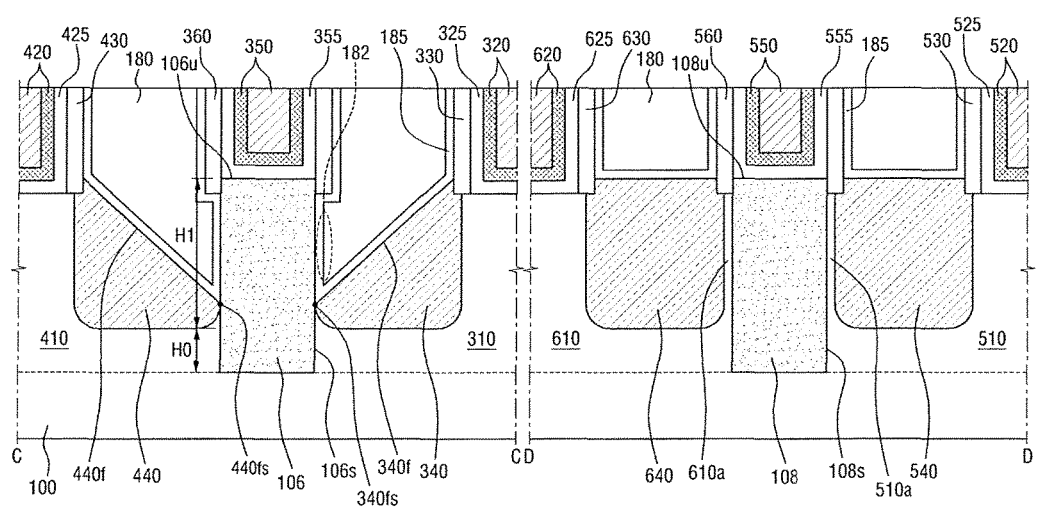
FIG. 15 is a cross-sectional view taken along lines C-C and D-D of FIG. 14, according to an exemplary embodiment of the present inventive concept.

FIG. 14 is a cross-sectional view illustrating a semiconductor device according to an exemplary embodiment of the present inventive concept and FIG. 15 is a cross-sectional view taken along lines C-C and D-D of FIG. 14, according to an exemplary embodiment of the inventive concept.

Referring to FIGS. 14 and 15, a semiconductor device 9 according to an exemplary embodiment of the present inventive concept may include a third multi-channel active pattern 310, a fourth multi-channel active pattern 410, a fifth multi-channel active pattern 510, a sixth multi-channel active pattern 610, a third gate electrode 320, a fourth gate electrode 420, a fifth gate electrode 520, a sixth gate electrode 620, a field insulation layer 105, a third source/drain 340, a fourth source/drain 440, a fifth source/drain 540, a sixth source/drain 640, a second dummy gate electrode 350, and a third dummy gate electrode 550. The semiconductor device 9 may further include a gate insulation layer 325, a gate spacer 330, a dummy gate insulation layer 355, a gate spacer 430, a gate insulation layer 425, a facet 440*f*, a facet starting point 440*fs*, a facet 340*f*, and a facet starting point 340*fs*. The semiconductor device 9 may further include a gate insulation layer 525, a dummy gate insulation layer 555, a top surface 108*u* of a third region 108 of a field insulation layer 105, a gate insulation layer 625, and a semiconductor portion 610*a*.

A substrate 100 may include a first region I and a second region II. The first region I and the second region II may be regions separated from each other or connected to each other.

In the semiconductor device 9 according to an exemplary embodiment of the present inventive concept, the first region I and the second region II of the substrate 100 may be regions where transistors having different conductivity types are formed. In other words, if the first region I of the substrate 100 is a P-type transistor forming region, the second region II of the substrate 100 may be an N-type transistor forming region. Conversely, if the first region I of the substrate 100 is an N-type transistor forming region, the second region II of the substrate 100 may be a P-type transistor forming region.

The third multi-channel active pattern 310, the fourth multi-channel active pattern 410, the third gate electrode 320, the fourth gate electrode 420, the third source/drain 340, the fourth source/drain 440, the second dummy gate electrode 350 and the second spacer 360 may be formed on the first region I of the substrate 100.

Respective explanations of these components may be substantially the same as those of the first multi-channel active pattern 110, the second multi-channel active pattern 210, the first gate electrode 120, the second gate electrode 220, the first source/drain 140, the second source/drain 240, the first dummy gate electrode 150 and the first spacer 160, shown in FIGS. 1 to 5, and thus repeated descriptions thereof will be omitted. In addition, first and second regions 106 and 107 of field insulation layer 105 may be substantially the same as those shown in FIGS. 1 to 5; accordingly, a repeated description will not be made.

In the semiconductor device 9 according to the current embodiment of the present inventive concept, a semiconductor portion formed on the first region I of the substrate 100 is substantially the same as the semiconductor device 1 shown in FIGS. 1 to 5, but exemplary embodiments of the present inventive concept are not limited thereto. The semiconductor portion formed on the first region I of the substrate 100 may be substantially the same as one of the semiconductor devices 2 to 8 shown in FIGS. 6 to 13.

On the second region II of the substrate 100, the fifth multi-channel active pattern 510 and the sixth multi-channel active pattern 610 may protrude from the substrate 100. The fifth multi-channel active pattern 510 and the sixth multi-channel active pattern 610 may extend lengthwise in a third direction X3.

Since the fifth multi-channel active pattern 510 and the sixth multi-channel active pattern 610 extend lengthwise in the third direction X3, they may include long sides extending in the third direction X3 and short sides extending in a fourth direction Y3.

The fifth multi-channel active pattern 510 and the sixth multi-channel active pattern 610 may include various kinds of semiconductor materials, as described above with reference to FIGS. 1 to 5. However, in describing the semiconductor device 9 according to the current embodiment of the present inventive concept, it is assumed that the fifth multi-channel active pattern 510 and the sixth multi-channel active pattern 610 are Si-containing fin type active patterns.

The field insulation layer 105 may be formed on the substrate 100 and may be disposed around the fifth multi-channel active pattern 510 and the sixth multi-channel active pattern 610. The field insulation layer 105 may be formed to surround portions of the fifth multi-channel active pattern 510 and the sixth multi-channel active pattern 610. In other words, the fifth multi-channel active pattern 510 and the sixth multi-channel active pattern 610 may be defined by the field insulation layer 105.

On the second region II of the substrate 100, the field insulation layer 105 may include a third region 108 and a fourth region 109 having different heights. The height of the fourth region 109 of the field insulation layer 105 may be H0 and the height of the third region 108 of the field insulation layer 105 may be (H0+H1).

Accordingly, the height of the first region 106 of the field insulation layer 105 on the first region I of the substrate 100 and the height of the third region 108 of the field insulation layer 105 on the second region II of the substrate 100 may be substantially equal to each other. In addition, the height of the second region 107 of the field insulation layer 105 on the first region I of the substrate 100 and the height of the fourth region 109 of the field insulation layer 105 on the second region II of the substrate 100 may be substantially equal to each other.

In FIGS. 14 and 15, since the height of the first region 106 of the field insulation layer 105 and the height of the third region 108 of the field insulation layer 105 are substantially equal to each other, a top surface of the third region 108 of the field insulation layer 105 may protrude upward from a top surface of the fifth multi-channel active pattern 510 and a top surface of the sixth multi-channel active pattern 610.

However, in FIGS. 14 and 15, when the semiconductor portion formed on the first region I of the substrate 100 is substantially the same as one of the semiconductor devices 2 to 8 shown in FIGS. 6 to 13, the third and fourth regions 108 and 109 of the field insulation layer 105 formed on the second region II of the substrate 100 may be varied to correspond to the first and second regions 106 and 107 of the field insulation layer 105 formed on the first region I of the substrate 100.

The fifth gate electrode 520 may extend in the fourth direction Y3 and may cross the fifth multi-channel active pattern 510. The fifth gate electrode 520 may be disposed on the field insulation layer 105 and the fifth multi-channel active pattern 510. The sixth gate electrode 620 may extend in the fourth direction Y3 and may cross the sixth multi-channel active pattern 610. The sixth gate electrode 620 may be disposed on the field insulation layer 105 and the sixth multi-channel active pattern 610.

The third dummy gate electrode 550 may extend in the fourth direction Y3 to be disposed on the third region 108 of the field insulation layer 105. The third dummy gate electrode 550 may be singly formed on the third region 108 of the field insulation layer 105.

Explanations of the fifth gate electrode 520, the sixth gate electrode 620 and the third dummy gate electrode 550 may be substantially the same as those of the first gate electrode 120 shown in FIGS. 1 to 5.

As described above, the third region 108 of the field insulation layer 105 and the fourth region 109 of the field insulation layer 105 may have different heights. The height of the third region 108 of the field insulation layer 105 may be (H0+H1) and the height of the fourth region 109 of the field insulation layer 105 may be H0.

A height of the third dummy gate electrode 550 may be different from heights of the fifth and sixth gate electrodes 520 and 620. A top surface of the third dummy gate electrode 550 and a top surface of the fifth and sixth gate electrodes 520 and 620 may be parallel (or coplanar) to each other.

A fifth gate spacer 530 may be disposed on a sidewall of the fifth gate electrode 520 extending in the fourth direction Y3. A sixth gate spacer 630 may be disposed on a sidewall of the sixth gate electrode 620 extending in the fourth direction Y3. A third spacer 560 may be disposed on a sidewall of the third dummy gate electrode 550 extending in the fourth direction Y3.

The fifth source/drain 540 may be disposed between the fifth gate electrode 520 and the third region 108 of the field insulation layer 105 and may be formed on the fifth multi-channel active pattern 510. The sixth source/drain 640 may be disposed between the sixth gate electrode 620 and the third region 108 of the field insulation layer 105 and may be formed on the sixth multi-channel active pattern 610. The fifth source/drain 540 and the sixth source/drain 640 may include epitaxial layers.

The fifth source/drain 540 may not contact a sidewall 108s of the third region 108 of the field insulation layer 105. In other words, a semiconductor portion 510a, in other words, a portion of the fifth multi-channel active pattern 510, may be interposed between the fifth source/drain 540 and the third region 108 of the field insulation layer 105.

In addition, the fifth source/drain 540 may contact the third spacer 560 and the fifth gate spacer 530. In other words, the fifth source/drain 540 may overlap with a portion of a sidewall of the third spacer 560 and a portion of a sidewall of the fifth gate spacer 530.

As shown in FIG. 15, a portion of the fifth source/drain 540 may be tucked beneath and around lower portions of the third spacer 560 and the fifth gate spacer 530.

An explanation of the sixth source/drain 640 may be substantially the same as that of the fifth source/drain 540.

Figure 16:
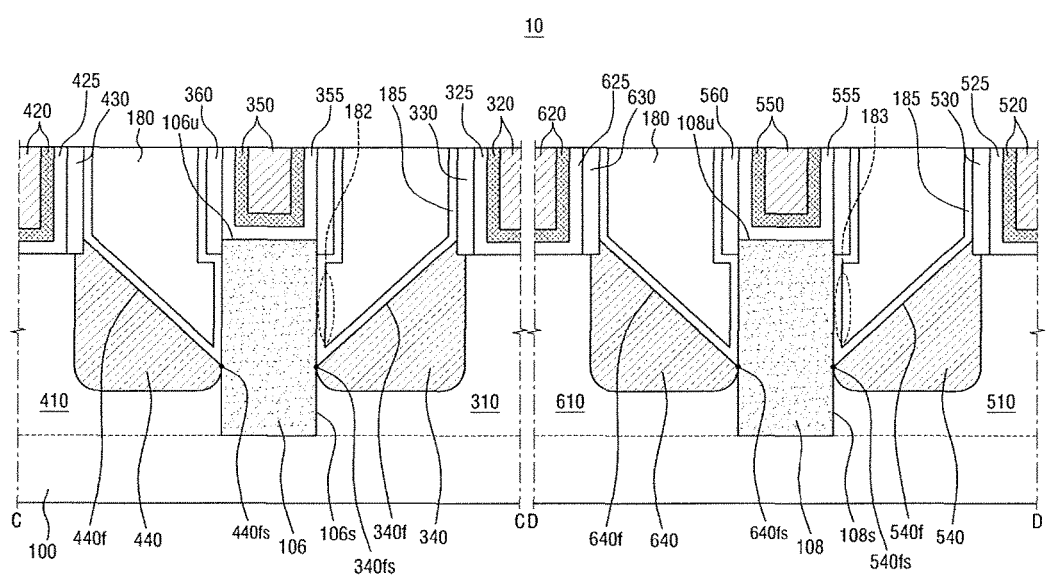
FIG. 16 is a cross-sectional view illustrating a semiconductor device according to an exemplary embodiment of the present inventive concept.

FIG. 16 is a cross-sectional view illustrating a semiconductor device according to an exemplary embodiment of the present inventive concept. For the sake of brevity, elements and features substantially the same as those shown and described with reference to FIGS. 14 to 15 may not be described.

Referring to FIG. 16, in a semiconductor device 10 according to an exemplary embodiment of the present inventive concept, a fifth source/drain 540 may include a fifth facet 540f. In addition, the fifth source/drain 540 may contact a third region 108 of a field insulation layer 105.

The fifth facet 540f may start from the third region 108 of the field insulation layer 105, which is lower than a top surface of a fifth multi-channel active pattern 510 and a top surface 108u of the third region 108 of the field insulation layer 105.

Since the fifth source/drain 540 contacts the third region 108 of the field insulation layer 105, a starting point 540fs of the fifth facet 540f may be included in (or at) a sidewall 108s of the third region 108 of the field insulation layer 105. In other words, the starting point 540fs of the fifth facet 540f may start from the sidewall 108s of the third region 108 of the field insulation layer 105.

In addition, a semiconductor material, for example, material that is the same as a fifth multi-channel active pattern 110, may not be provided between the fifth facet 540f and the sidewall 108s of the third region 108 of the field insulation layer 105.

In the semiconductor device 10 according to the current embodiment of the present inventive concept, the fifth source/drain 540 may not include an interfacial surface extending along the sidewall 108s of the third region 108 of the field insulation layer 105.

In FIG. 16, at least a portion of the third spacer 560 may laterally protrude from the sidewall 108s of the third region 108 of the field insulation layer 105. However, since the fifth source/drain 540 includes the fifth facet 540f starting from the sidewall 108s of the third region 108 of the field insulation layer 105, the fifth source/drain 540 may not contact the third spacer 560.

In addition, at least a bottom surface of the third spacer 560 may overlap with the fifth source/drain 540.

An explanation of the sixth source/drain 640 may be substantially the same as that of the fifth source/drain 540. For example, a starting point 640fs of a sixth facet 640f may be included in (or at) the sidewall 108s of the third region 108 of the field insulation layer 105.

In FIG. 16, the sidewall 108s of the third region 108 of the field insulation layer 105, which is farther from the substrate 100 than the starting point 540fs of the fifth facet 540f and the starting point 640fs of the sixth facet 640f, may not contact the semiconductor material.

Therefore, an insulating material may be provided between the third spacer 560 and a region of the fifth source/drain 540 overlapping with the third spacer 560 and between the third spacer 560 and a region of the sixth source/drain 640 overlapping with the third spacer 560.

In other words, a third insulation pattern 183 including an interlayer insulation layer 180 and/or an etch stop layer 185 may be disposed between the third spacer 560 and a region of the fifth source/drain 540 overlapping with the third spacer 560 and between the third spacer 560 and a region of the sixth source/drain 640 overlapping with the third spacer 560.

Figure 17:
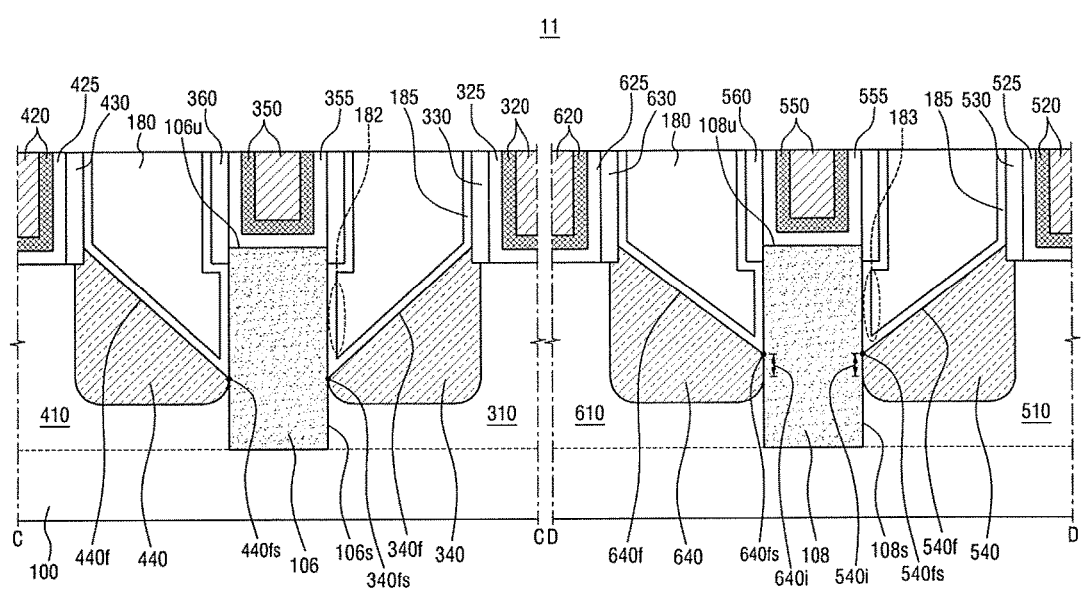
FIG. 17 is a cross-sectional view illustrating a semiconductor device according to an exemplary embodiment of the present inventive concept.
Figure 18:
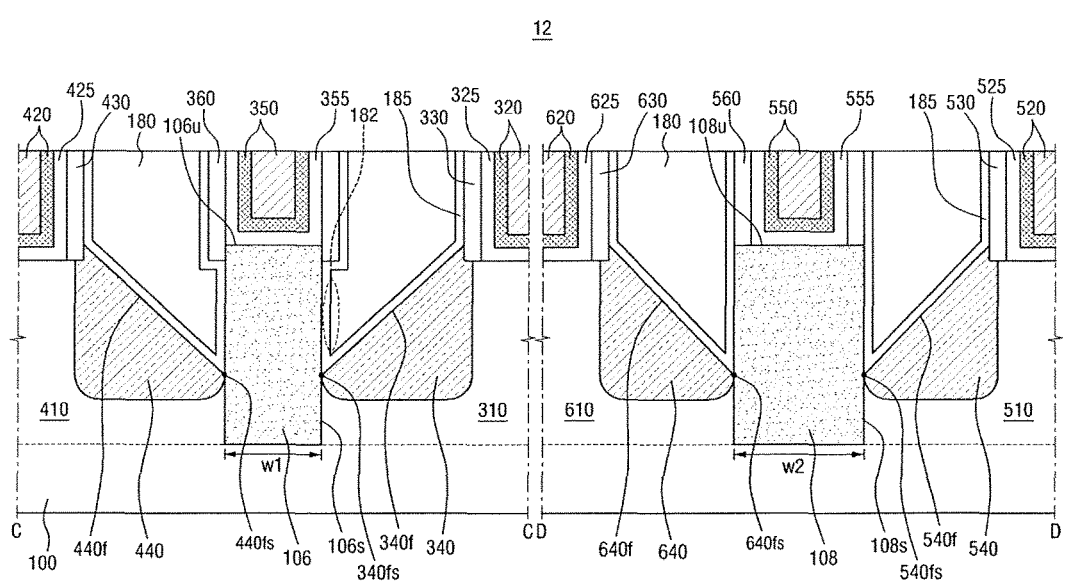
FIG. 18 is a cross-sectional view illustrating a semiconductor device according to an exemplary embodiment of the present inventive concept.

FIG. 17 is a cross-sectional view illustrating a semiconductor device according to an exemplary embodiment of the present inventive concept and FIG. 18 is a cross-sectional view illustrating a semiconductor device according to an exemplary embodiment of the present inventive concept. For the sake of brevity, elements and features substantially the same as those shown and described with reference to FIG. 16 may not be described.

Referring to FIG. 17, in a semiconductor device 11 according to an exemplary embodiment of the present inventive concept, a fifth source/drain 540 may include a fifth interfacial surface 540i extending along a sidewall 108s of a third region 108 of a field insulation layer 105.

Accordingly, a starting point 540fs of the fifth facet 540f and a starting point 640fs of a sixth facet 640f may not come in contact with fifth and sixth multi-channel active patterns 510 and 610, respectively.

On the sidewall 108s of the third region 108 of the field insulation layer 105, the fifth interfacial surface 540i may extend from the starting point 540fs of the fifth facet 540f to the first multi-channel active pattern 510 and a sixth interfacial surface 640i may extend from the starting point 640fs of the sixth facet 640f to the sixth multi-channel active pattern 610.

Referring to FIG. 18, in a semiconductor device 12 according to an exemplary embodiment of the present inventive concept, a width W1 of a first region 106 of a field insulation layer 105 and a width W2 of a third region 108 of the field insulation layer 105 may be different from each other.

For example, the width W1 of the first region 106 of the field insulation layer 105 may be a width ranging in a direction X2, in which lengthwise parallel long sides of the third and fourth multi-channel active patterns 310 and 410 extend.

In addition, the width W2 of the third region 108 of the field insulation layer 105 may be a width ranging in a direction X3, in which lengthwise parallel long sides of the fifth and sixth multi-channel active patterns 510 and 610 extend.

In FIG. 18, the width W1 of the first region 106 of the field insulation layer 105 is less than the width W2 of the third region 108 of the field insulation layer 105.

Accordingly, the third spacer 560 disposed on opposite sidewalls of the third dummy gate electrode 550 may be formed on a top surface 108u of the third region 108 of the field insulation layer 105. In other words, the third spacer 560 may not laterally protrude from the sidewall 108s of the third region 108 of the field insulation layer 105.

Since a bottom surface of the third spacer 560 faces the top surface 108u of the third region 108 of the field insulation layer 105, the bottom surface of the third spacer 560 may not contact the etch stop layer 185.

The bottom surface of the third spacer 560 may not overlap with a fifth source/drain 540 and a sixth source/drain 640. Therefore, an insulating material may not be interposed between the third spacer 560 and the fifth source/drain 540 and between the third spacer 560 and the sixth source/drain 640.

In addition, a second insulation pattern 182 including an interlayer insulation layer 180 and/or an etch stop layer 185 may be interposed between the second spacer 360 and the third source/drain 340 and between the second spacer 360 and the fourth source/drain 440.

Figure 19:
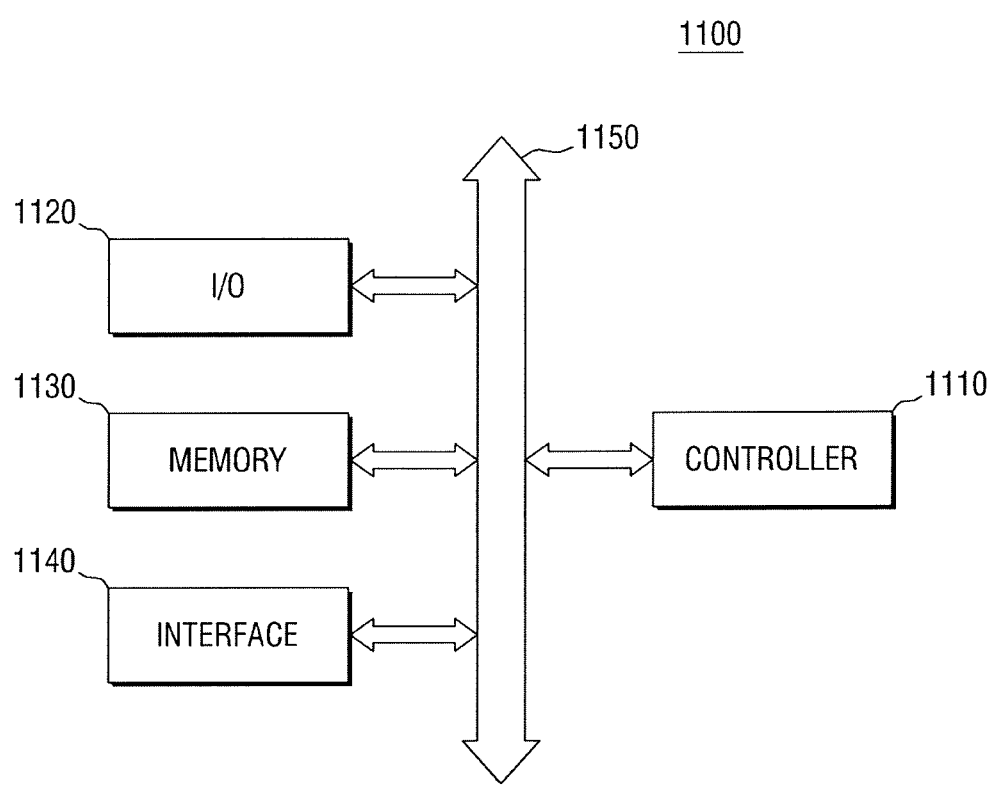
FIG. 19 is a block diagram of an electronic system including semiconductor devices according to exemplary embodiments of the present inventive concept.

FIG. 19 is a block diagram of an electronic system including semiconductor devices according to exemplary embodiments of the present inventive concept.

Referring to FIG. 19, an electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include a microprocessor, a digital signal processor, a microcontroller, or logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. The electronic system 1100 may further include a high-speed dynamic random access memory (DRAM) and/or a static random access memory (SRAM) as a working memory for the operation of the controller 1110. The semiconductor devices 1 to 12 according to exemplary embodiments of the present inventive concept may be provided in the memory device 1130 or may be provided as components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 20:
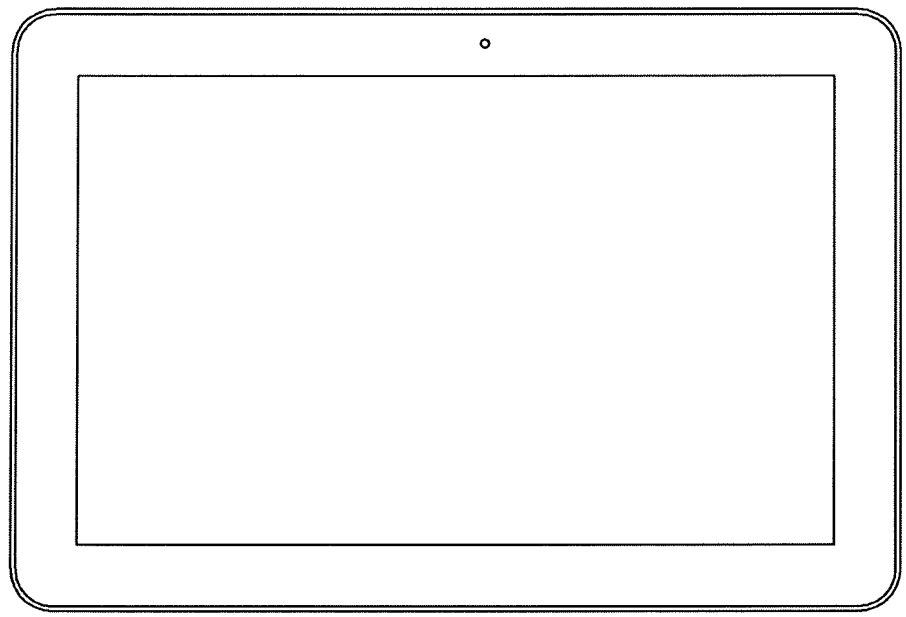
FIGS. 20 and 21 illustrate semiconductor systems to which semiconductor devices according to exemplary embodiments of the present inventive concept can be applied.
Figure 21:
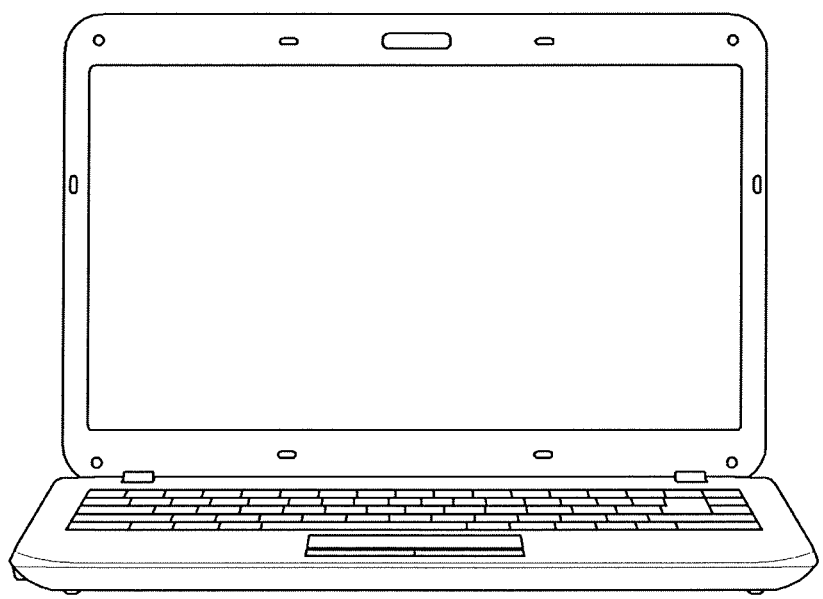

FIGS. 20 and 21 illustrate semiconductor systems to which semiconductor devices according to exemplary embodiments of the present inventive concept can be applied. FIG. 20 illustrates an example in which a semiconductor device according to an exemplary embodiment of the present inventive concept is applied to a tablet personal computer (PC) and FIG. 21 illustrates an example in which a semiconductor device according to an exemplary embodiment of the present inventive concept is applied to a notebook computer. At least one of the semiconductor devices according to exemplary embodiments of the present inventive concept can be employed to a tablet PC, a notebook computer, and the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
a multi-channel active pattern;
a field insulation layer disposed on the multi-channel active pattern and including a first region and a second region, the first region having a top surface protruding from a top surface of the second region to a top surface of the multi-channel active pattern;
a gate electrode crossing the multi-channel active pattern, the gate electrode being disposed on the field insulation layer;
a source or drain disposed between the gate electrode and the first region of the field insulation layer and including a facet that is a slanted sidewall, the facet being disposed adjacent to the first region of the field insulation layer at a point lower than the top surface of the multi-channel active pattern; and
a dummy gate electrode disposed on the first region of the field insulation layer.

2. The semiconductor device of claim 1, wherein the source or drain contacts the first region of the field insulation layer.

3. The semiconductor device of claim 2, wherein the facet contacts a sidewall of the first region of the field insulation layer.

4. The semiconductor device of claim 1, wherein a top surface of the gate electrode is coplanar with a top surface of the dummy gate electrode.

5. The semiconductor device of claim 1, further comprising a spacer disposed on a sidewall of the dummy gate electrode, wherein at least a portion of a bottom surface of the spacer overlaps with the source or drain.

6. The semiconductor device of claim 5, further comprising an insulation pattern interposed between the spacer and a region of the source or drain overlapping with the spacer.

7. A semiconductor device, comprising:
a first multi-channel active pattern;
afield insulation layer disposed on the first multi-channel active pattern and including a first region and a second region, the first region having a top surface protruding from a top surface of the second region to a top surface of the first multi-channel active pattern;
a first gate electrode crossing the first multi-channel active pattern, the first gate electrode being disposed on the field insulation layer;
a first source or drain disposed between the first gate electrode and the first region of the field insulation layer and including a first facet that is a slanted sidewall, the first facet being disposed adjacent to the first region of the field insulation layer at a point lower than the top surface of the first multi-channel active pattern;
a second multi-channel active pattern parallel with the first multi-channel active pattern, the first region of the field insulation layer being interposed between the first multi-channel active pattern and the second multi-channel active pattern;
a second gate electrode crossing the second multi-channel active pattern, the second gate electrode being disposed on the field insulation layer; and
a second source or drain disposed between the second gate electrode and the first region of the field insulation layer,
wherein the second source or drain includes a second facet disposed adjacent to the sidewall of the first region of the field insulation layer.

8. The semiconductor device of claim 7, further comprising:
a dummy gate electrode disposed on the first region of the field insulation layer; and
a spacer disposed on a sidewall of the dummy gate electrode, wherein a bottom surface of the spacer overlaps with the first source or drain and the second source or drain.

9. A semiconductor device, comprising:
a multi-channel active pattern;
a field insulation layer disposed on at least two sides of the multi-channel active pattern and including a first region and a second region;
a dummy gate electrode disposed on the first region of the field insulation layer;
a gate electrode crossing the multi-channel active pattern, the gate electrode being disposed on the second region of the field insulation layer, the gate electrode having a height greater than that of the dummy gate electrode; and
a source or drain disposed between the gate electrode and the dummy gate electrode and including a facet,
wherein the facet is adjacent to a sidewall of the first region of the field insulation layer.

10. The semiconductor device of claim 9, wherein a material interposed between the facet and the sidewall of the first region of the field insulation layer is different from a material of the multi-channel active pattern.

11. The semiconductor device of claim 9, wherein a height of the first region of the field insulation layer is greater than a height of the second region of the field insulation layer.

12. A semiconductor device, comprising:
a multi-channel active pattern;
a field insulation layer disposed on first and second sides of the multi-channel active pattern, the field insulation layer including a first region extending to a top surface of the multi-channel active pattern;
a gate electrode overlapping the multi-channel active pattern and disposed on the field insulation layer on the first and second sides of the multi-channel active pattern; and
a source or drain disposed between the gate electrode and the first region of the field insulation layer, the source or drain including a slanted edge that extends from the first region of the field insulation layer to a spacer adjacent to the gate electrode.

13. The semiconductor device of claim 12, wherein a material different from a material of the multi-channel active pattern is disposed in an area adjacent to the edge of the source or drain.

14. The semiconductor device of claim 13, wherein a sidewall of the first region of the field insulation layer forms a side of the area adjacent to the edge of the source or drain.

15. The semiconductor device of claim 14, wherein an insulation pattern is disposed along the side of the area adjacent to the edge of the source or drain.

16. The semiconductor device of claim 12, wherein a dummy gate electrode is disposed on the first region of the field insulation layer.

* * * * *